(12) United States Patent
Tsai et al.

(10) Patent No.: US 12,436,465 B2
(45) Date of Patent: Oct. 7, 2025

(54) METHOD OF PROCESSING A SUBSTRATE

(71) Applicant: NANYA TECHNOLOGY CORPORATION, New Taipei (TW)

(72) Inventors: Chih-Ying Tsai, New Taipei (TW); Jui-Seng Wang, New Taipei (TW); Yi-Yi Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 740 days.

(21) Appl. No.: 17/855,924

(22) Filed: Jul. 1, 2022

(65) Prior Publication Data

US 2024/0004300 A1    Jan. 4, 2024

(51) Int. Cl.
  *G03F 7/20*   (2006.01)
  *G03F 7/00*   (2006.01)
  *G03F 7/09*   (2006.01)
  *H01L 21/027*  (2006.01)
  *H01L 21/308*  (2006.01)

(52) U.S. Cl.
  CPC ............ *G03F 7/2047* (2013.01); *G03F 7/091* (2013.01); *G03F 7/70466* (2013.01); *H01L 21/0274* (2013.01); *H01L 21/3086* (2013.01)

(58) Field of Classification Search
  CPC .... G03F 7/2047; G03F 7/091; G03F 7/70466; G03F 7/0035; G03F 7/203; H01L 21/0274; H01L 21/3086; H01L 21/31144; H01L 21/76816; H10B 12/053; H10B 12/315; H10B 12/482
  USPC ...................... 430/5, 311, 312, 333
  See application file for complete search history.

(56) References Cited

U.S. PATENT DOCUMENTS

| | | | |
|---|---|---|---|
| 6,589,713 B1 | 7/2003 | Okoroanyanwu | |
| 7,814,650 B2 | 10/2010 | Tang | |
| 9,097,975 B2 | 8/2015 | Yang | |
| 11,264,321 B2 | 3/2022 | Chang Chien et al. | |
| 2004/0232432 A1 | 11/2004 | Sato et al. | |
| 2006/0024945 A1 | 2/2006 | Kim et al. | |
| 2007/0072133 A1 | 3/2007 | Chen | |
| 2008/0187860 A1 | 8/2008 | Tsubaki et al. | |
| 2014/0377708 A1* | 12/2014 | Yang | G03F 7/20 430/326 |

(Continued)

OTHER PUBLICATIONS

Office Action and the search report mailed on Oct. 16, 2023 related to Taiwanese Application No. 112108901.

(Continued)

*Primary Examiner* — Caleen O Sullivan
(74) *Attorney, Agent, or Firm* — Xuan Zhang

(57) ABSTRACT

The present application provides a method of processing a substrate. The method of processing the substrate includes steps of forming a photosensitive layer on the substrate; performing a first exposure process to expose the photosensitive layer to actinic radiation through a first mask; performing a first developing process to remove portions of the photosensitive layer exposed to the actinic radiation and form an intermediate pattern; performing a second exposure process to expose the intermediate pattern to the actinic radiation through a second mask; performing a second developing process to remove portions of the intermediate pattern shielded from the actinic radiation and form a target pattern; and performing an etching process to remove portions of the substrate exposed by the target pattern.

13 Claims, 23 Drawing Sheets

(56) References Cited

U.S. PATENT DOCUMENTS

2019/0187562 A1* 6/2019 Wang .................. H01L 21/3213

OTHER PUBLICATIONS

Office Action and and the search report mailed on Feb. 25, 2025 related to U.S. Appl. No. 17/856,194.

* cited by examiner

METHOD OF PROCESSING A SUBSTRATE

TECHNICAL FIELD

The present disclosure relates to a method of processing semiconductor substrate, and more particularly, to a method of fabricating a pattern to be transferred onto a semiconductor substrate utilizing a dual-tone development approach.

DISCUSSION OF THE BACKGROUND

Dynamic random-access memory (DRAM), a type of volatile memory storage device, is an indispensable portion of many electronic products. DRAM includes a great number of memory cells arranged for forming an array configured to store data. Each memory cell 10 is arranged at an intersection of a word line WL and a bit line BL and includes an access transistor 110 and a storage capacitor 120, as shown in FIG. 1. The access transistors 110 are rendered conductive in response to a voltage applied to the access transistors 110, which then connect the storage capacitors 120 to associated bit lines BL.

In general, the access transistors 110 are electrically connected to the bit lines BL via conductive plugs (conductive vias) penetrating through one or more dielectric layers between the access transistors 110 and the bit lines BL. Currently, a default pattern for the formation of trenches used to accommodate the conductive plugs is defined in a hardmask for patterning the dielectric layers using a lithography-etch-lithography-etch (LELE) approach.

When the LELE approach is carried out, a first photoresist layer is firstly applied over the dielectric layers; portions of the default pattern (hereinafter referred to as the "first pattern") are formed in the first photoresist layer through a first lithography process, and a first etching process is performed to transfer the first pattern to a target layer between the dielectric layers and the first photoresist layer for patterning the dielectric layers. In other words, the target layer functions as the hardmask for patterning the dielectric layers. After the first etching process, the residual first photoresist layer is removed from the target layer, and a second photoresist layer is then applied over the target layer. Subsequently, a second lithography process is performed to form other portions of the default pattern (hereinafter referred to as the "second pattern") in the second photoresist layer, and a second etching process is performed to transfer the second pattern in to the target layer. Accordingly, a complicated and precise default pattern is formed in the target layer.

However, after the first lithography process, the target layer having the first pattern formed thereon may directly contact the etchant or the chemical solvent used in the second lithography process and the second etching process, and, as a result, the first pattern formed in the target layer may be deformed or the exposed surface of the target layer may be damaged, which may reduce the correctness of the first pattern and adversely affect subsequent manufacturing processes.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of processing a substrate. The method includes steps of forming a photosensitive layer on the substrate; performing a first exposure process to expose the photosensitive layer to actinic radiation through a first mask; performing a first developing process to remove portions of the photosensitive layer exposed to the actinic radiation and form an intermediate pattern; performing a second exposure process to expose the intermediate pattern to the actinic radiation through a second mask; performing a second developing process to remove portions of the intermediate pattern shielded from the actinic radiation and form a target pattern; and performing an etching process to remove portions of the substrate exposed through the target pattern.

In some embodiments, the first mask and the second mask have complementary geometric patterns.

In some embodiments, the first mask has a plurality of first transparent portions and a plurality of first opaque portions alternately arranged with the plurality of first transparent portions, the second mask has a plurality of second transparent portions and a plurality of second opaque portions alternately arranged with the plurality of second transparent portions, the plurality of first transparent portions and the plurality of second opaque portions have a first length, and the plurality of first opaque portions and the plurality of second transparent portions have a second length different from the first length.

In some embodiments, the first length is less than the second length.

In some embodiments, after the first exposure process, the photosensitive layer includes a plurality of first exposed portions that correspond to the plurality of first transparent portions of the first mask and a plurality of first unexposed portions that correspond to the plurality of first opaque portions of the first mask, and the first developing process utilizes a positive-tone developer to remove the plurality of first exposed portions.

In some embodiments, after the second exposure process, the intermediate pattern includes a plurality of second exposed portions that correspond to the plurality of second transparent portions of the second mask and a plurality of second unexposed portions that correspond to the plurality of second opaque portions of the second mask, wherein the second developing process utilizes a negative-tone developer to remove the plurality of second unexposed portions.

In some embodiments, during the second exposure process, the plurality of second opaque portions are respectively arranged above the plurality of first unexposed portions.

In some embodiments, during the second exposure process, centers of the plurality of second opaque portions of the second mask are aligned with centers of the plurality of first unexposed portions.

In some embodiments, the method further includes a step of depositing an ARC layer on the substrate prior to the formation of the photosensitive layer, wherein portions of the ARC layer exposed to the target pattern are removed during the etching process.

One aspect of the present disclosure provides a method of fabricating bit line contacts over a substrate. The method includes steps of depositing an insulative layer and a sacrificial layer on the substrate; forming a photosensitive layer on the sacrificial layer; performing a first exposure process to expose the photosensitive layer to actinic radiation through a first mask; performing a first developing process to form an intermediate pattern on the sacrificial layer; performing a second exposure process to expose the intermediate pattern to the actinic radiation through a second mask; performing a second developing process to form a target pattern on the sacrificial layer; performing a first etching process to remove portions of the sacrificial layer exposed by the target pattern; performing a second etching process to form a plurality of trenches in the insulative layer, wherein impurity regions of the substrate are exposed to the plurality of trenches; and depositing a conductive material into the plurality of trenches to form the bit line contacts.

In some embodiments, the first developing process utilizes a positive-tone developer to remove portions of the photosensitive layer exposed to the actinic radiation, and the second developing process utilizes a negative-tone developer to remove portions of the intermediate pattern shielded from the actinic radiation.

In some embodiments, the first mask and the second mask have complementary geometric patterns.

In some embodiments, the first mask has a plurality of first transparent portions and a plurality of first opaque portions in a staggered configuration, the second mask has a plurality of second transparent portions and a plurality of second opaque portions in a staggered configuration, the plurality of first transparent portions and the plurality of second opaque portions have a first length, and the plurality of first opaque portions and the plurality of second transparent portions have a second length different from the first length.

In some embodiments, the first length is less than the second length.

In some embodiments, after the first exposure process, the photosensitive layer includes a plurality of first exposed portions that correspond to the plurality of first transparent portions of the first mask and a plurality of first unexposed portions that correspond to the plurality of first opaque portions of the first mask, and the first exposed portions are removed after the first developing process.

In some embodiments, after the second exposure process, the intermediate pattern includes a plurality of second exposed portions that correspond to the plurality of second transparent portions of the second mask and a plurality of second unexposed portions that correspond to the plurality of second opaque portions of the second mask, and the second developing process removes the plurality of second unexposed portions.

In some embodiments, during the second exposure process, the plurality of second opaque portions are arranged above the plurality of first unexposed portions, respectively.

In some embodiments, the insulative layer has a thickness of about 200 nm, and the sacrificial layer comprises carbon and has a thickness of about 50 nm.

In some embodiments, the method further includes a step of depositing an antireflective coating (ARC) layer on the sacrificial layer prior to the formation of the photosensitive layer, wherein portions of the ARC layer exposed to the target pattern are removed during the first etching process.

In some embodiments, the ARC layer has a thickness of about 50 nm.

In some embodiments, the method further includes a step of depositing a buffer layer on the insulative layer prior to the deposition of the sacrificial layer, and the buffer layer is etched using a patterned ARC layer and a patterned sacrificial layer formed after the first etching process.

In some embodiments, the buffer layer functions as an etch stop layer during the first etching process.

In some embodiments, the buffer layer has a thickness in a range of about 20 nm to about 30 nm.

In some embodiments, the method further includes a step of performing a removal process to remove the patterned ARC layer, the patterned sacrificial layer, and a patterned buffer layer after the second etching process.

In some embodiments, the method further includes a step of performing a planarizing process to remove the conductive material above the trenches.

In some embodiments, the method further includes a step of removing the target pattern from the ARC layer after the first etching process.

One aspect of the present disclosure provides a method of processing a substrate. The method includes steps of forming the sacrificial layer on the substrate; forming a photosensitive layer on the sacrificial layer; performing a first lithographing process to remove portions of the photosensitive layer exposed to actinic radiation and form an intermediate pattern on the sacrificial layer; performing a second lithographing process to remove portions of the intermediate pattern shielded from the actinic radiation and form a target pattern on the sacrificial layer; and etching through the target pattern to form openings in the sacrificial layer.

In some embodiments, the photosensitive layer is exposed to the actinic radiation through a first mask during the first lithographing process, the intermediate pattern is exposed to the actinic radiation through a second mask during the second lithographing process, and the first and second masks have complementary geometric patterns.

In some embodiments, the first mask has a plurality of first transparent portions and a plurality of first opaque portions, adjacent first transparent portions are separated by one of the plurality of first opaque portions, the plurality of first transparent portions have a first length, and the plurality of first opaque portions have a second length greater than the first length.

In some embodiments, the intermediate pattern is formed using a positive-tone development, and the target pattern is formed using a negative-tone development.

The above-mentioned method defines the target pattern in the ARC layer and the sacrificial layer using a lithography-lithography-etch approach to reduce the steps for the formation of trenches and prevent reduction of a correctness of the formed pattern.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
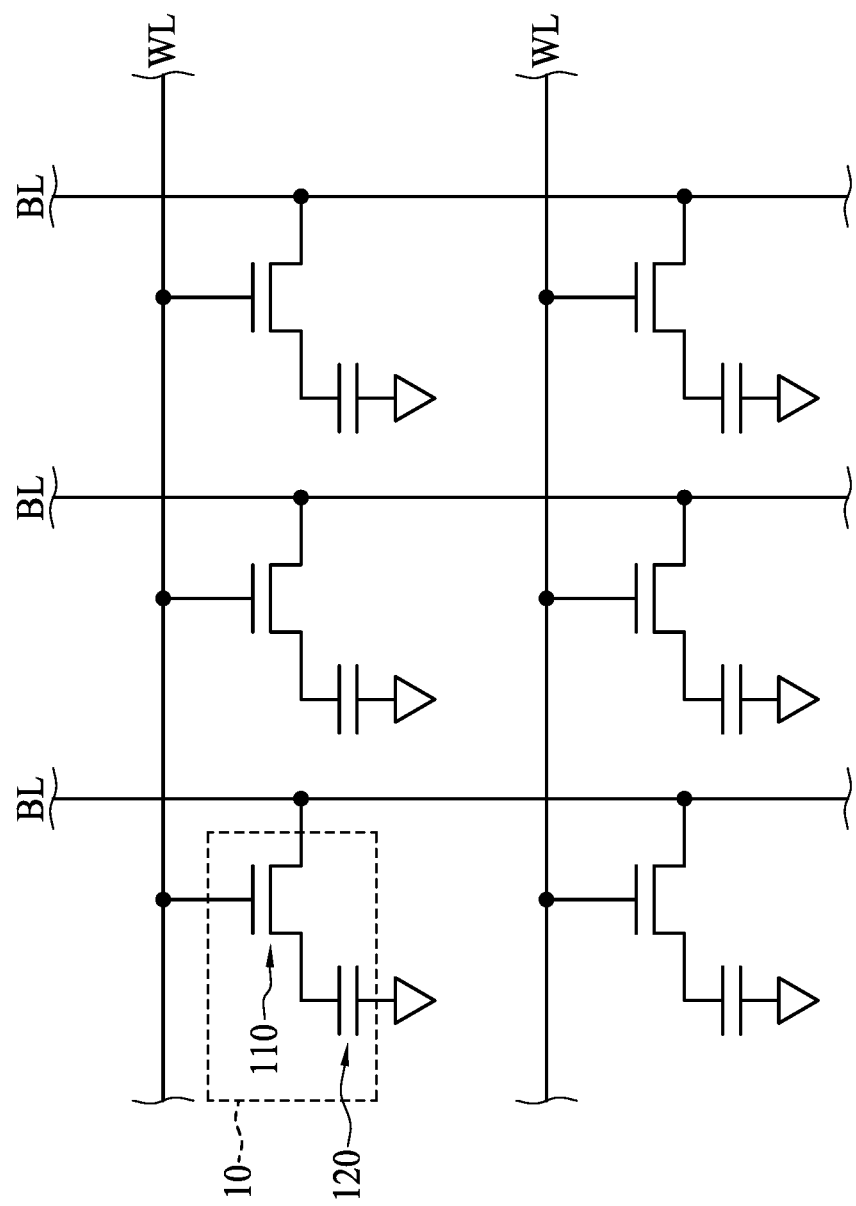
FIG. 1 shows a circuit diagram of a plurality of memory cells in a dynamic random-access memory.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
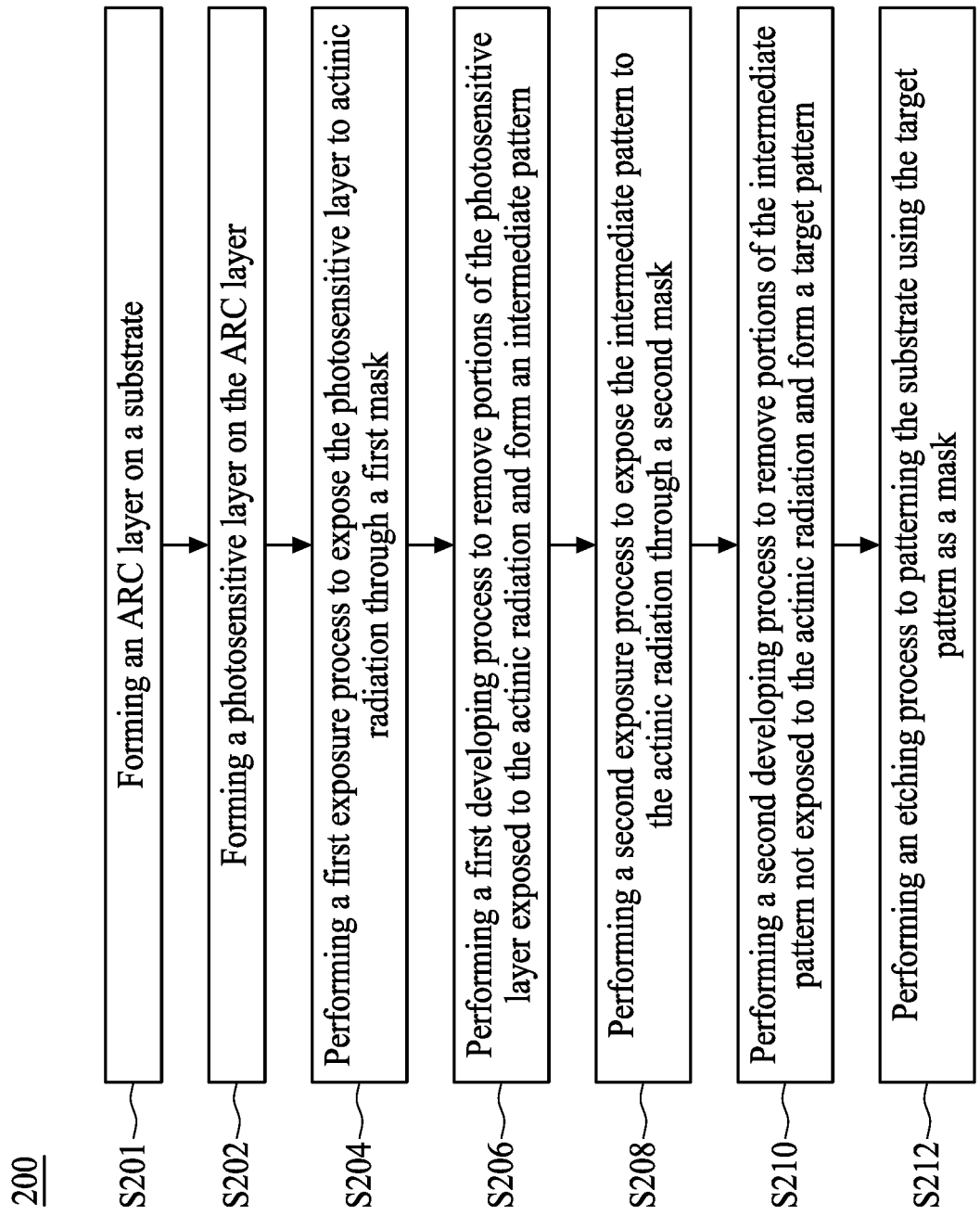
FIG. 2 shows a flow diagram illustrating a method of patterning a substrate in accordance with some embodiments of the present disclosure.

FIG. 2 illustrates a flow diagram illustrating a method 200 of patterning a substrate in accordance with some embodiments of the present disclosure, and FIGS. 3 through 9 illustrate cross-sectional views of intermediate stages in the patterning of the substrate in accordance with some embodiments of the present disclosure. The stages shown in FIGS. 3 to 9 are referred to in the flow diagram in FIG. 2. In the following discussion, the fabrication stages shown in FIGS. 3 to 9 are discussed in reference to the process steps shown in FIG. 2.

Figure 3:
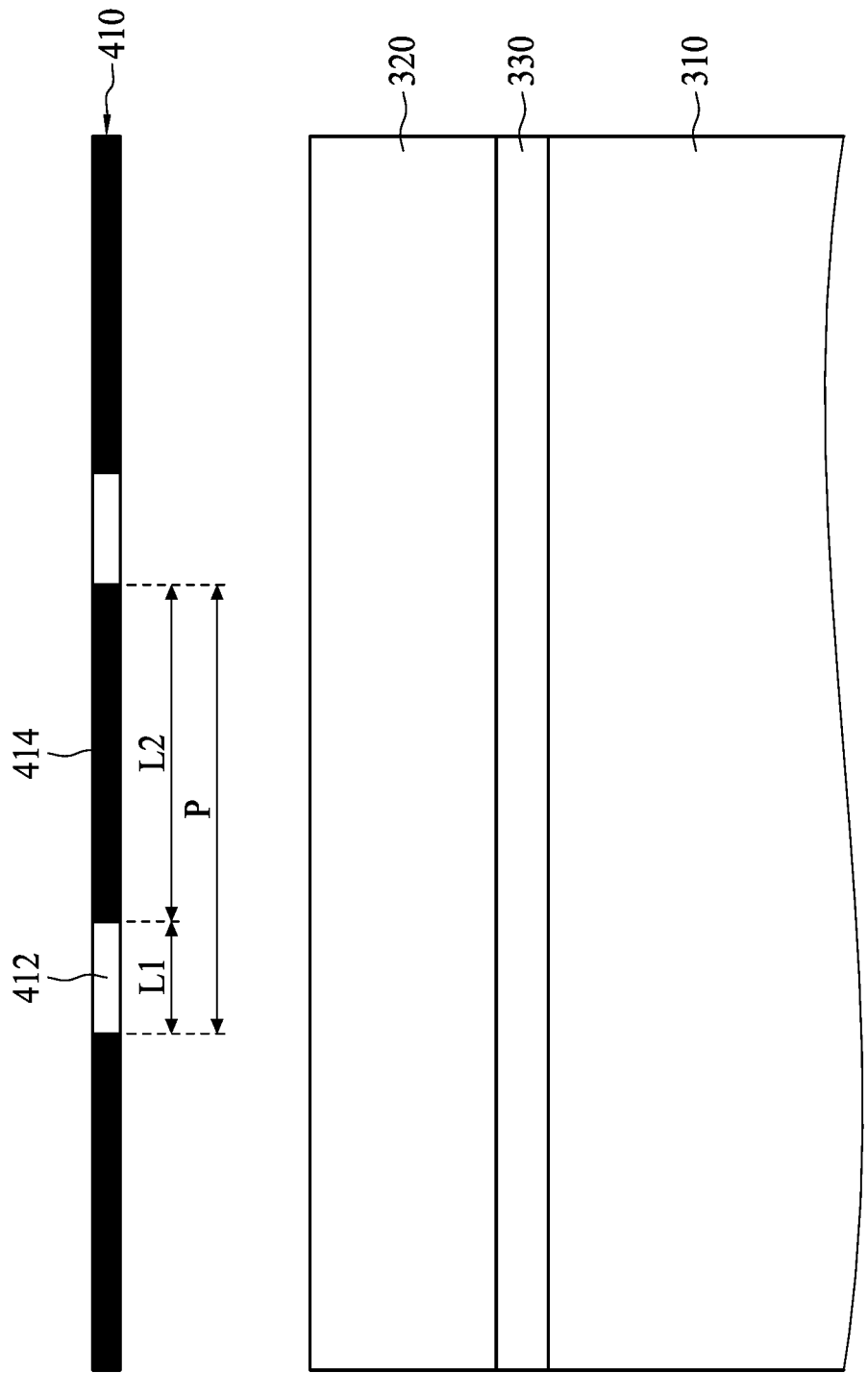
FIGS. 3 through 9 illustrate cross-sectional views of intermediate stages in the formation of conductive features in accordance with some embodiments of the present disclosure.

Referring to FIG. 3, a photosensitive layer 320 is formed on a substrate 310 according to step S202 in FIG. 2. The substrate 310 can include a layer of a single material (such as silicon, germanium, or any other semiconductor material), a plurality of layers of different materials, a layer or layers having regions of different materials or structures used to fabricate integrated circuits, active microelectronic devices (such as transistors and/or diodes) and passive microelectronic devices (such as capacitors, resistors or the like). The materials mentioned above may include semiconductors, insulators, conductors, or combinations thereof.

The photosensitive layer 320 can be applied on the substrate 310 by a spin-coating process. Subsequently, a soft-baking process may be performed to dry the photosensitive material 320. The soft-baking process can remove solvent from the photosensitive layer 320, fully cover the substrate 310, and harden the photosensitive layer 320.

In some embodiments, an antireflective coating (ARC) layer 330 can be optionally deposited immediately between the substrate 310 and the photosensitive layer 320 while an upper surface of the substrate 310 is relatively flat. The ARC layer 330 is formed on the substrate 310 according to step S201 in FIG. 2. The ARC layer 330 formed on the substrate 310 prior to the formation of the photosensitive layer 320 is used to minimize the optical reflection of actinic radiation used to expose the photosensitive layer 320, as will be described below. The ARC layer 330 can be formed using a chemical vapor deposition (CVD) process, a spin-coating process or another suitable process.

Next, a first mask 410 is provided above the photosensitive layer 320. The first mask 410 includes a plurality of first transparent portions 412 and a plurality of first opaque portions 414 that form a first geometric pattern to be transferred onto the photosensitive layer 320. The first transparent portions 412 and the first opaque portions 414 may be arranged in a staggered configuration. That is, adjacent first transparent portions 412 are spaced apart by one of the first opaque portions 414. The first mask 410 may be a binary mask or a phase shift mask. The first mask 410 can have a minimum pitch P that is achievable with current photolithographic equipment, wherein the pitch P represents a length including one first transparent portion 412 and one first opaque portion 414. In some embodiments, the first transparent portions 412 have a first length L1, and the first opaque portions 414 have a second length L2 greater than the first length L1.

Figure 4:
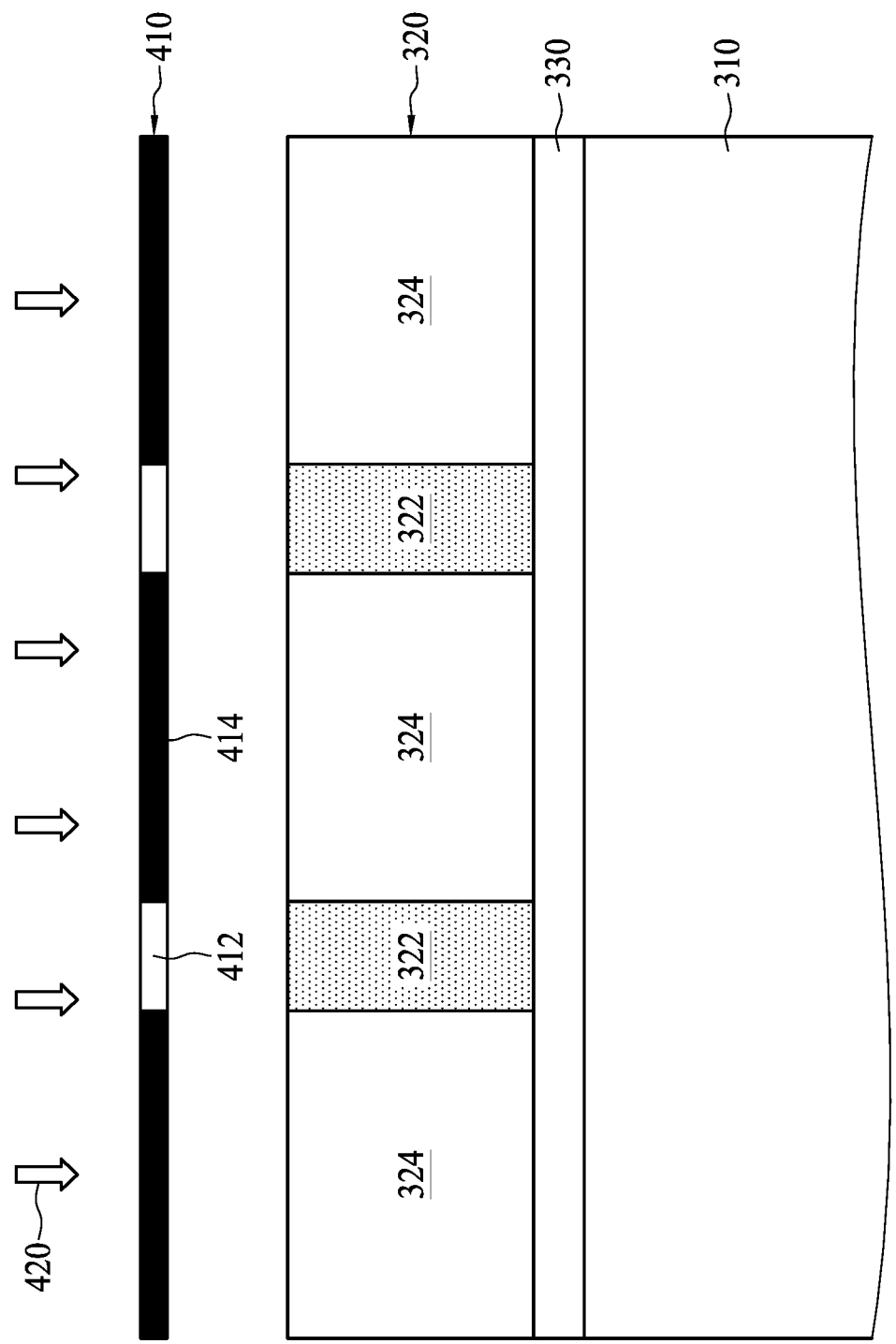

Referring to FIG. 4, a first exposure process is performed to expose the photosensitive layer 320 to actinic radiation 420 through the first mask 410 according to step S204 in FIG. 2. During the first exposure process, the first transparent portions 412 of the first mask 410 allow the actinic radiation 420 to irradiate the photosensitive layer 320, while the first opaque portion 414 of the first mask 410 prevents the actinic radiation 420 from irradiating the photosensitive layer 320, so that a duplicate of the first geometric pattern appears in the photosensitive layer 320. After the first exposure process, the photosensitive layer 320 includes a plurality of first exposed portions 322 that correspond to the first transparent portions 412 of the first mask 410 and a plurality of first unexposed portions 324 that correspond to the first opaque portions 414 of the first mask 410.

Figure 5:
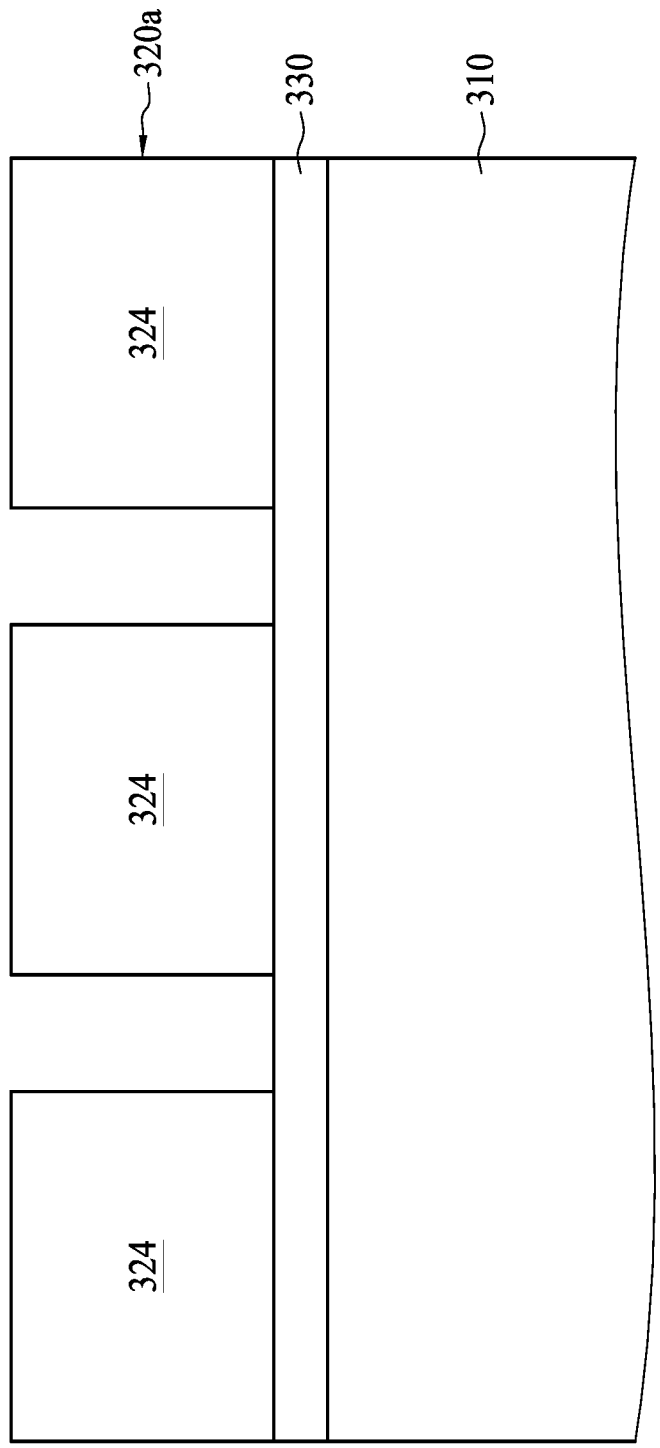

Referring to FIG. 5, a first developing process is performed to remove the first exposed portions 322 according to step S206 in FIG. 2. Specifically, the substrate 310 having the photosensitive layer 320 and the ARC layer 330 is immersed into a first developer to preferentially remove the first exposed portions 322, such that an intermediate pattern 320a comprised of the first unexposed portions 324 is formed. After the first developing process, portions of the ARC layer 330 are exposed through the intermediate pattern 320a. The first developer is a positive-tone developer (PTD) that selectively dissolves and removes the first exposed portions of the photosensitive layer 320.

Figure 6:
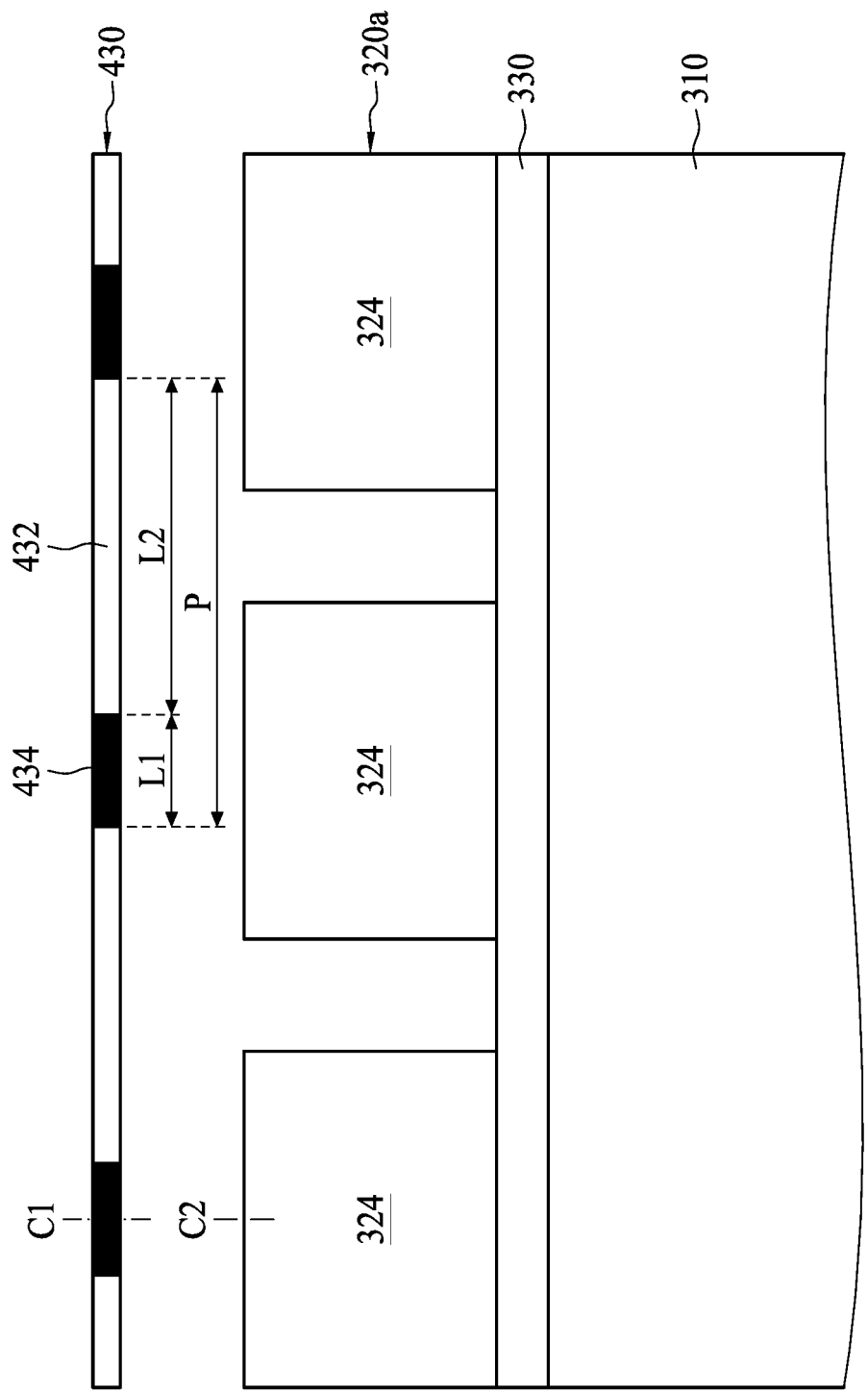

Referring to FIG. 6, a second mask 430 is provided above the intermediate pattern 320a. The second mask 430 includes a plurality of second transparent portions 432 and a plurality of second opaque portions 434 that form a second geometric pattern. As illustrated in FIG. 6, adjacent second opaque portions 434 are separated by one of the plurality of transparent portions 432 when viewed in a cross-sectional view. The second mask 430 can have the minimum pitch P. The transparent portions 432 of the second mask 430 have the second length L2, and the second opaque portions 434 of the second mask 430 have the first length L1. That is, the first mask 410 and the second mask 430 have complementary geometric patterns. In some embodiments, the second opaque portions 434 of the second mask 430 are arranged above the first unexposed portions 324, respectively, and edges of the second opaque portions 434 are offset from edges of the first unexposed portions 324.

Figure 7:
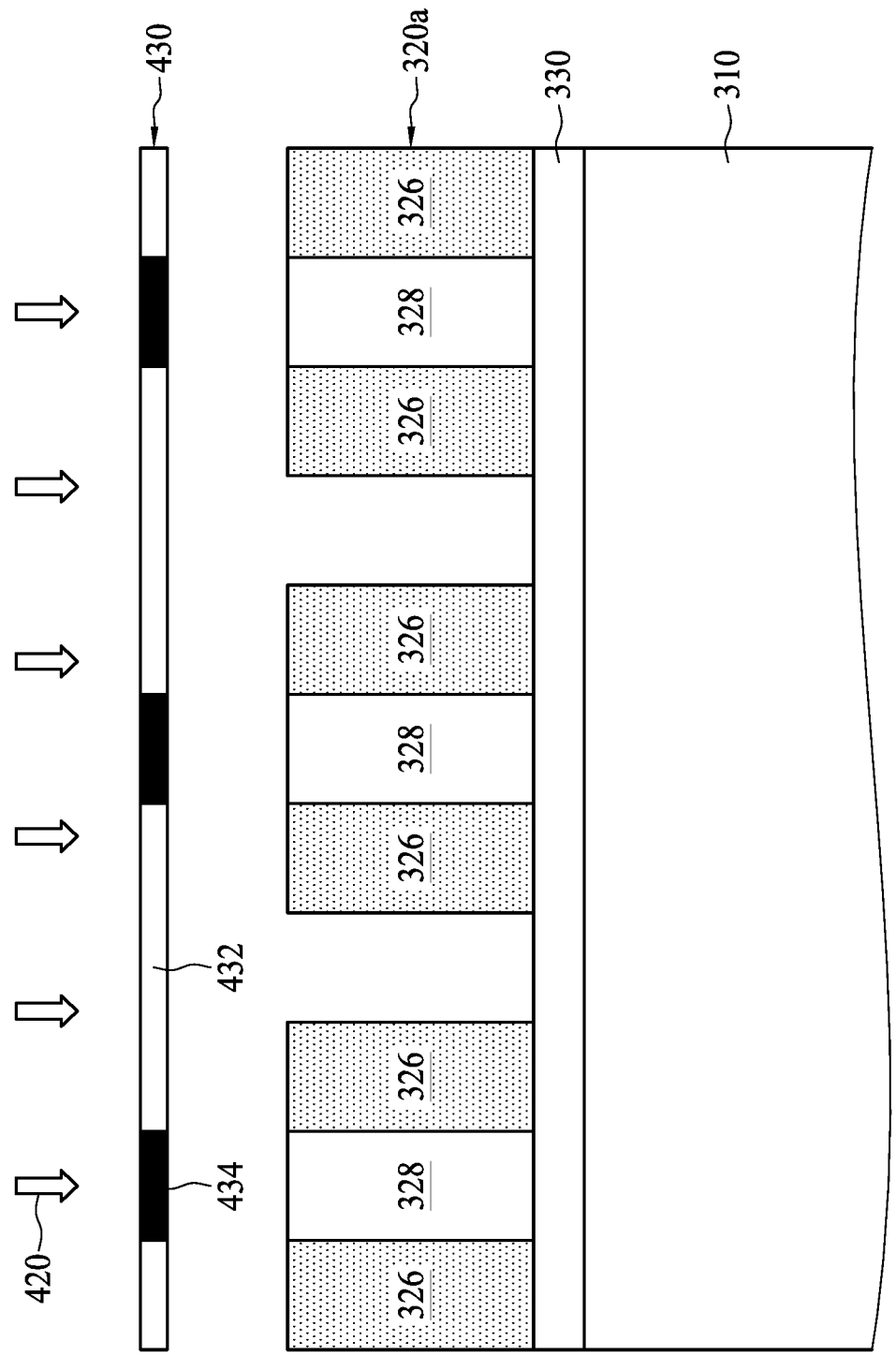

Referring to FIG. 7, a second exposure process is performed to expose the intermediate pattern 320a and the portions of the ARC layer 330 exposed by the intermediate pattern 320a to the actinic radiation 420 through the second mask 430 according to step S208 in FIG. 2. Referring to FIGS. 6 and 7; during the second exposure process, the actinic radiation 420 radiates through the second transparent portions 432 and irradiates portions of the intermediate pattern 320a and the portions of the ARC layer 330 exposed through the intermediate pattern 320a. The actinic radiation 420 irradiating the second opaque portions 434 may be absorbed by the opaque portions 434, so that portions of the intermediate pattern 320a directly below the second opaque portions 434 are shielded from the actinic radiation 420. Hence, after the second exposure process, the intermediate pattern 320a includes a plurality of second exposed portions 326 that correspond to the second transparent portions 432 and a plurality of second unexposed portions 328 corresponding to the second opaque portions 434.

Figure 8:
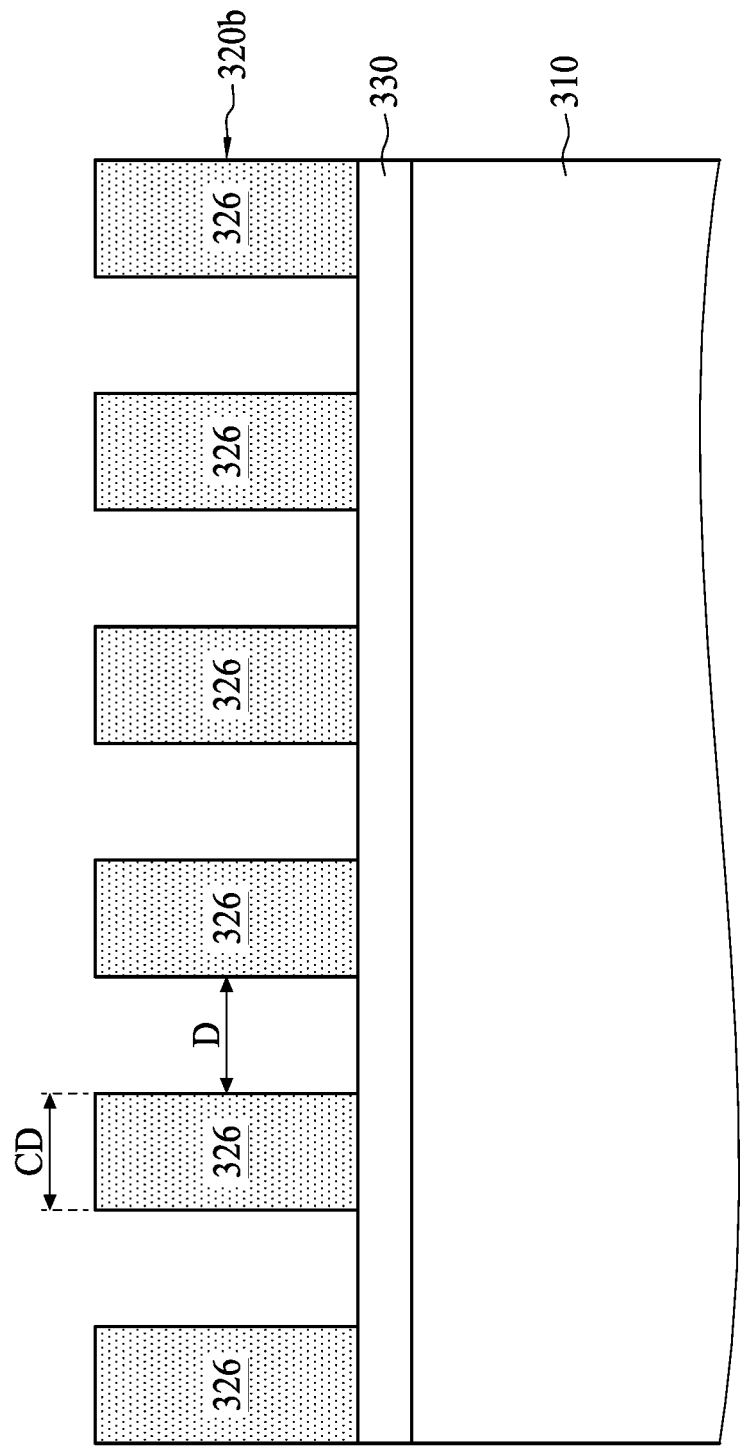

Referring to FIG. 8, a second developing process is performed according to step S210 in FIG. 2. Referring to FIGS. 7 and 8; during the second developing process, the second unexposed portions 328 are dissolved and removed using a second developer, such that a target pattern 320b comprised of the second exposed portions 326 is formed. The second developer is a negative-tone developer (NTD). In some embodiments, the second developer is, for example, an organic developer. After the second developing step, a post-baking process is performed, which drives off the solvent from the target pattern 320b and toughens and improves the adhesion of the target pattern 320b.

Notably, critical dimensions CD of the second exposed portions 328 can be defined by a ratio of the first length L1 to the second length L2 shown in FIGS. 4 and 6 and an alignment of the second mask 430 during the second exposure process. For example, when the ratio of the first length L1 to the second length L2 is 1:3, and centers C1 of the second opaque portions 434 of the second mask 430 are aligned with centers C2 of the first unexposed portions 324 during the second exposure process, the second exposed portions 328 can have the same critical dimension and be spaced with an interval D equal to the critical dimension CD.

Figure 9:
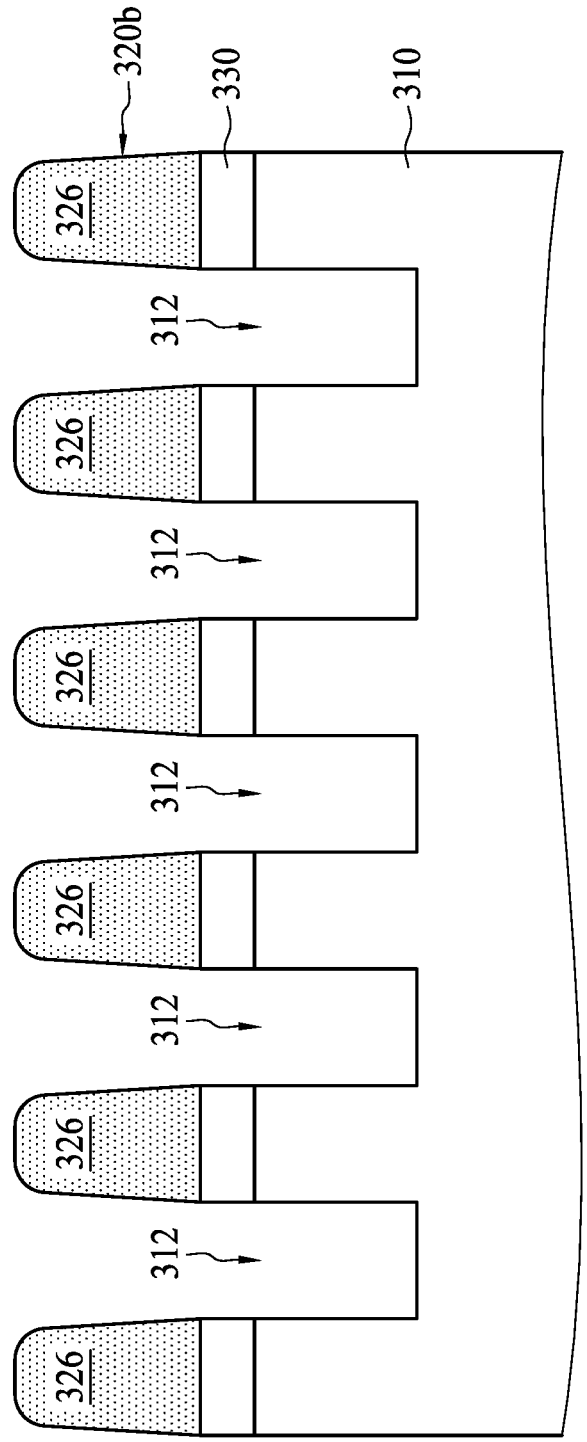

Referring to FIG. 9, an etching process is performed to remove portions of the ARC layer 330 and portions of the substrate 310 exposed by the target pattern 320b; therefore, a plurality of trenches 312 capable of being filled with conductive material, dielectric material and/or semiconductive material are formed in the substrate 310. The ARC layer 330 and the substrate 310 can be anisotropically dry-etched, using a reactive-ion etching (RIE) process, for example, so that the width of spaces between the second exposed portions 326 is maintained in the trenches 312. It should be noted that the etching step may utilize multiple etchants, selected based on the materials of the substrate 310 and the ARC layer 330, to sequentially etch the ARC layer 330 and the substrate 310.

In comparison with the LELE approach, which performs the lithographic process and the etching process twice each to form the default pattern for the formation of the trenches in the target layer, the method 200 utilizes a dual-tone development approach followed by an etching process, which can reduce the number of steps for the formation of the target pattern 320a and thus for the formation of the trenches 312.

Figure 10:
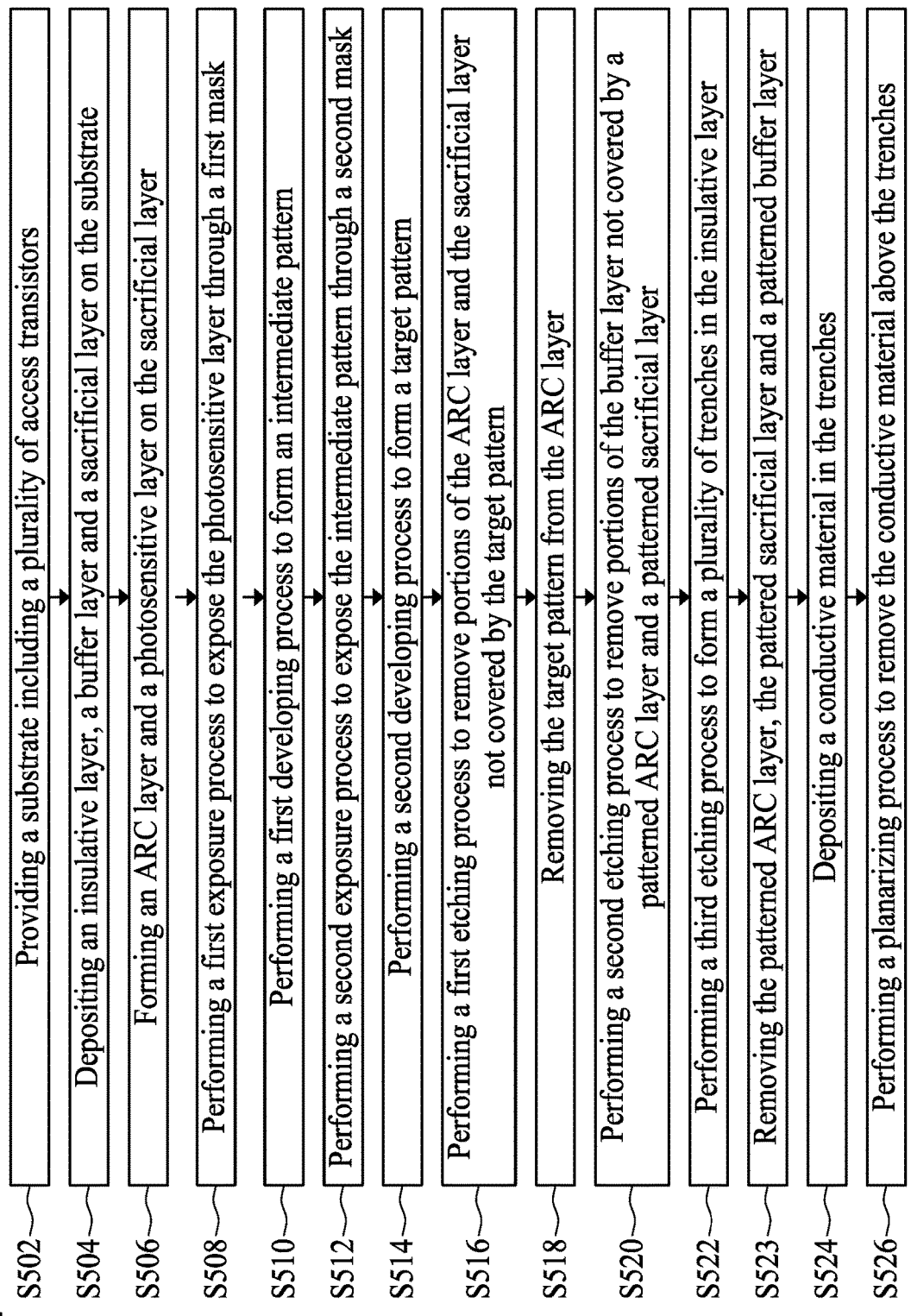
FIG. 10 shows a flow diagram illustrating a method of fabricating bit line contacts of a semiconductor storage device in accordance with some embodiments of the present disclosure.
Figure 11:
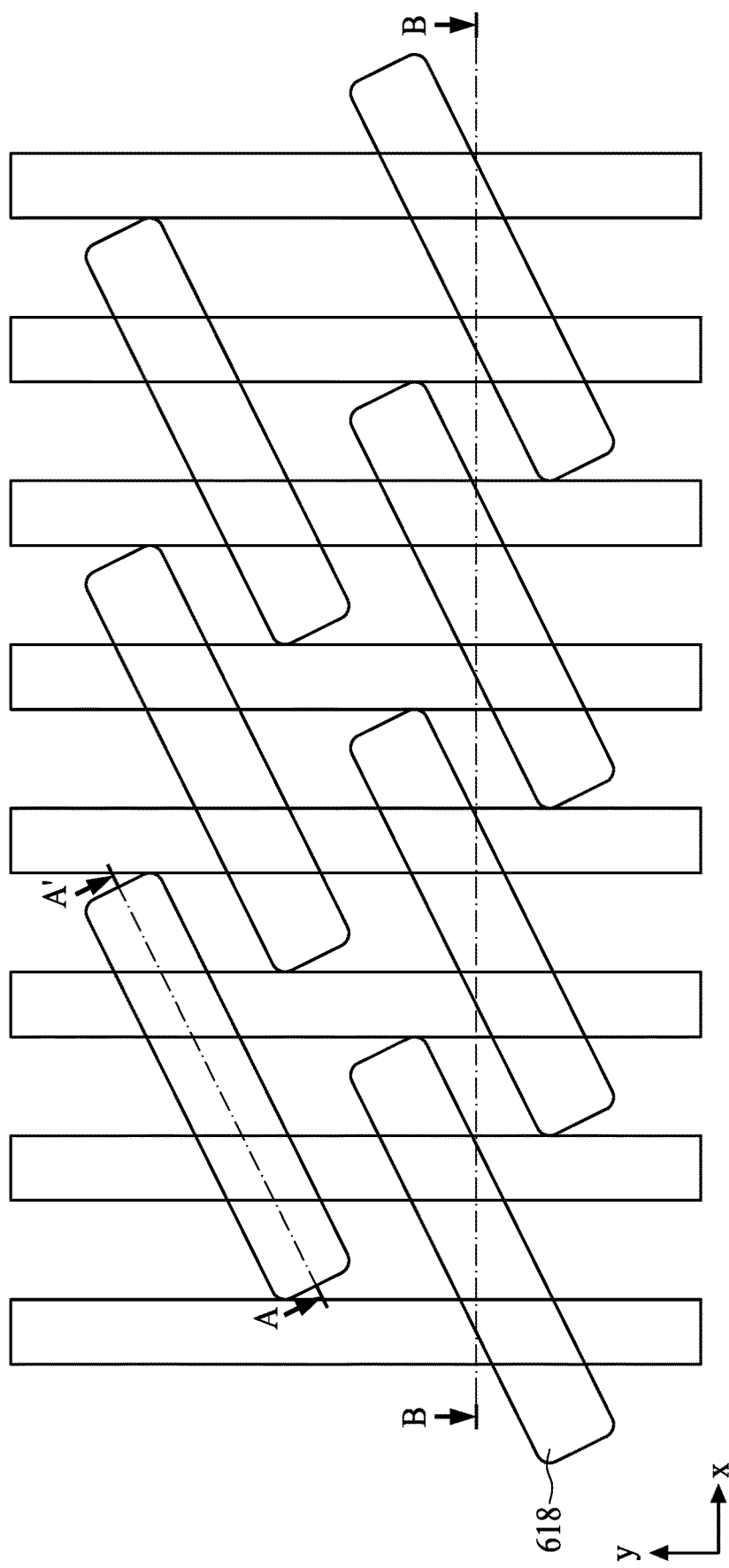
FIG. 11 illustrates a plan view of an intermediate stage in the formation of the bit line contacts in accordance with some embodiments of the present disclosure.

FIG. 10 shows a flow diagram illustrating a method 500 of fabricating bit line contacts of a semiconductor storage device in accordance with some embodiments of the present disclosure, FIG. 11 is a plan view of an intermediate stage in the formation of the bit line contacts in accordance with some embodiments of the present disclosure, and FIGS. 12 through 23 illustrate cross-sectional views of intermediate stages in the formation of the bit line contacts in accordance with some embodiments of the present disclosure. The stages shown in FIGS. 11 to 23 are referred to in the flow diagram in FIG. 10. In the following discussion, the fabrication stages shown in FIGS. 11 to 23 are discussed in reference to the process steps shown in FIG. 10.

Figure 12:
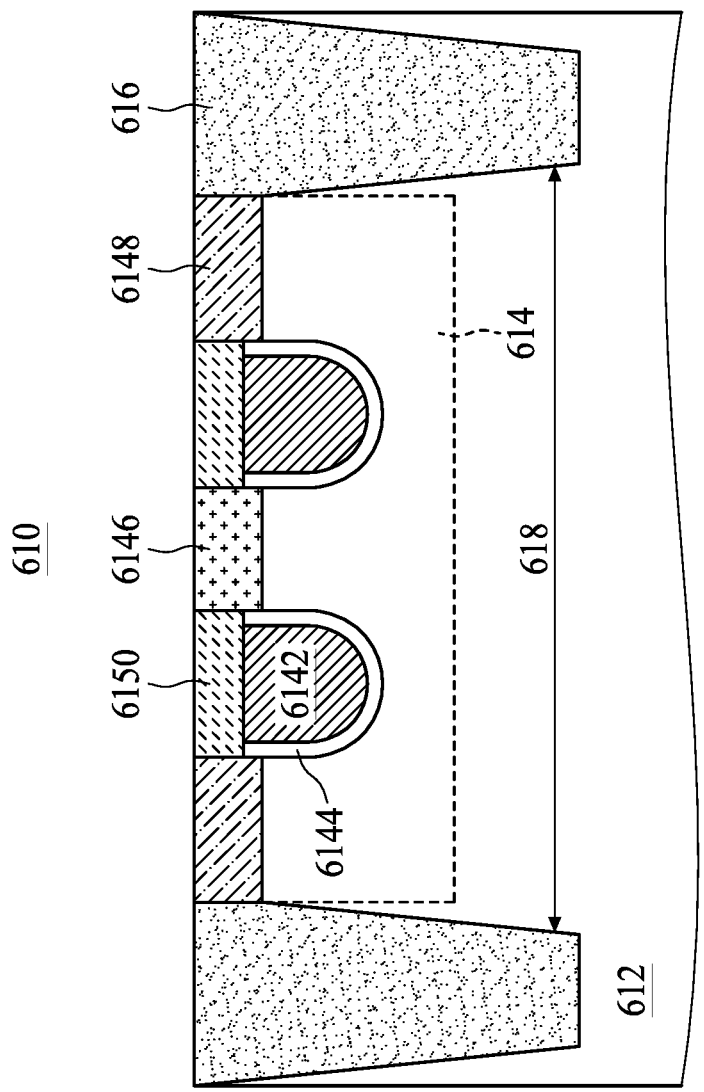
FIG. 12 is a cross-sectional view taken along a line A-A' in FIG. 11.
Figure 13:
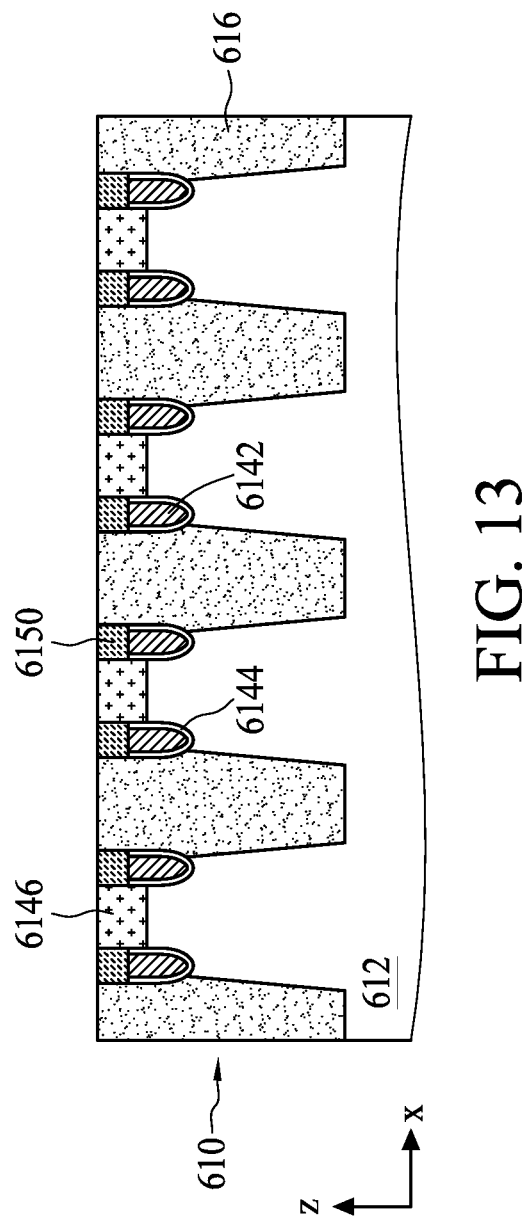
FIG. 13 is a cross-sectional view taken along a line B-B' in FIG. 11.

Referring to FIGS. 11 to 13, a substrate 610 including a plurality of access transistors 614 is provided according to step 502 in FIG. 10. The substrate 610 includes a semiconductor wafer 612 where the access transistors 614 are disposed. The semiconductor wafer 612 can be made of silicon. Alternatively or additionally, the semiconductor wafer 612 may include other elementary semiconductor materials such as germanium. In some embodiments, the semiconductor wafer 612 is made of a compound semiconductor such as silicon carbide, gallium arsenic, or indium phosphide. In some embodiments, the semiconductor wafer 612 is made of an alloy semiconductor such as silicon germanium or silicon germanium carbide, gallium arsenic phosphide, or gallium indium phosphide. In some embodiments, the semiconductor wafer 612 can include an epitaxial layer. For example, the semiconductor wafer 612 has an epitaxial layer overlying a bulk semiconductor.

Isolation features 616, such as shallow trench isolation (STI) features, can be introduced in the semiconductor wafer 612 to define a plurality of active areas 618. As illustrated in FIG. 11, the active regions 618 are disposed such that major axes (along a longitudinal direction) of the active regions 618 are parallel to neither an x-axis nor a y-axis of an orthogonal coordinate system, wherein the x-axis is orthogonal to the y-axis.

The access transistors 614 are in a form of a recessed access device (RAD) transistor; however, in some embodiments, the access transistors 614 may be planar access device (PAD) transistors. The access transistors 614 include a plurality of word lines 6142, a plurality of gate insulators 6144, a first impurity region 6146 and a plurality of second impurity regions 6148. The word lines 6142 are disposed in the substrate 610. As illustrated in FIG. 11, the word lines 6142 extend longitudinally along the y-axis and across the active regions 618 and function as gates in the access transistors 614 through which they pass. Referring to FIGS. 12 and 13, the gate insulators 6144 are disposed between the semiconductor wafer 612 and the word lines 6142. The first impurity region 6146 and the second impurity regions 6148 are disposed between sides of the word lines 6142. The access transistors 614 may include a passivation layer 6150 disposed in the substrate 610 and used to cap the word lines 6142 and the gate insulators 6144.

Figure 14:
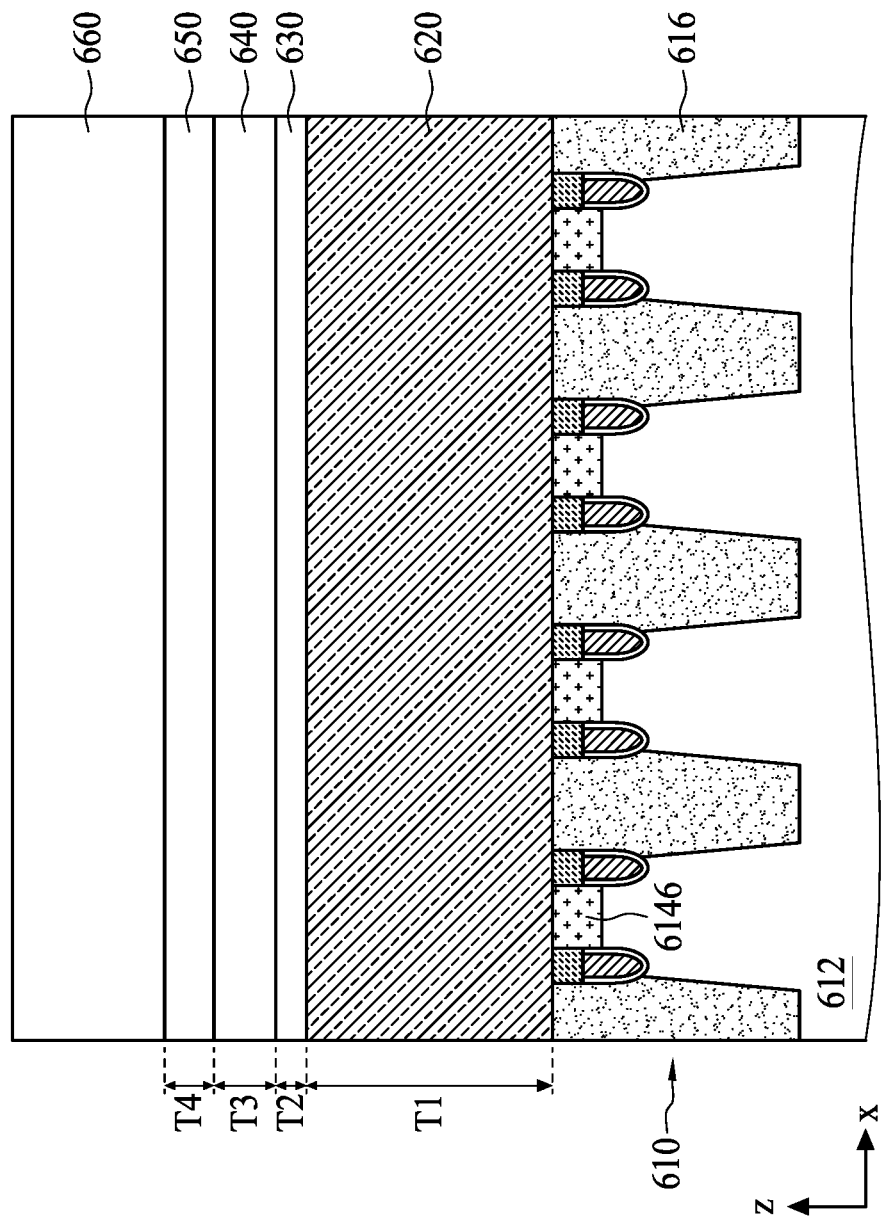
FIGS. 14 through 23 illustrate cross-sectional views of intermediate stages in the formation of the bit line contacts in accordance with some embodiments of the present disclosure.

Referring to FIG. 14, an insulative layer 620, a buffer layer 630 and a sacrificial layer 640 are sequentially stacked on the substrate 610 according to step 504 in FIG. 10. The insulative layer 620, including dielectric material, can have a first thickness T1 of about 200 nm. In some embodiments, the insulative layer 620 may include oxide, tetraethylorthosilicate (TEOS), undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or combinations thereof. The insulative layer 620 is deposited on the substrate 610 using a CVD process. After the deposition, the insulative layer 620 may be planarized, using, for example, a chemical mechanical polishing (CMP) process, to yield an acceptably flat topology.

Because the insulative layer 620 can be mechanically weak, and may be damaged during the deposition of the sacrificial layer 640, the buffer layer 630, which is mechanically stronger, is deposited on the insulative layer 620. In addition, the buffer layer 630 may also provide sufficient selectivity between the insulative layer 620 and the sacrificial layer 640. In some embodiments, the buffer layer 630 can be formed of, for example, carbon-doped silicon oxide (SiCOH), which offers high etch selectivity relative to the sacrificial layer 640. The buffer layer 630 is deposited on the insulative layer 620 using a CVD process, a spin-coating process or another suitable process. As shown in FIG. 14, the buffer layer 630 has a second thickness T2, which is, for example, in a range of about 20 nm to about 30 nm.

The sacrificial layer 640, which includes a high-hardness material, is blanketly deposited on the buffer layer 630. The sacrificial layer 640 may include carbonaceous materials which are suitable for etching by various plasma-based etching process. Suitable materials which may be utilized for the sacrificial layer 640 include doped and undoped amorphous carbon materials. The sacrificial layer 640 may be formed or deposited with a third thickness T3 dependent on the material's resistance to the process chemistries and conditions used to subsequently etch the insulative layer 620 while maintaining suitable structural integrity of the sacrificial layer 640 and/or the insulative layer 620. The third thickness T3 of the sacrificial layer 640 is, for example, about 60 nm. The sacrificial layer 640 may be deposited using a CVD process, a plasma-enhanced CVD process, a spin-coating process or another suitable process.

Next, an ARC layer 650 and a photosensitive layer 660 are sequentially formed on the sacrificial layer 640 according to step S506 in FIG. 10. The ARC layer 650 is tuned to provide minimal reflection and high contrast for desired wavelengths employed during patterning of the photosensitive layer 660. The ARC layer 650 having high oxygen content may also improve adhesion of the photosensitive layer 660 applied by spin-on techniques, which may not otherwise adhere well to the sacrificial layer 640. The ARC layer 650 may be made of an inorganic material including oxygen, to form a silicon dioxide material or a silicon oxynitride material. The ARC layer 650 can have a fourth thickness T4 of about 50 nm. The ARC layer 650 can be formed using a CVD process, a plasma-enhanced CVD process, a spin-coating process or another suitable process.

The photosensitive layer 660, such as a photoresist, is uniformly applied on the ARC layer 650 by a spin-coating process. The formed photosensitive layer 660 fully covers the ARC layer 650. In some embodiments, a soft baking process may be performed on the photosensitive layer 660. The soft baking process may remove a solvent remaining within the photosensitive layer 660. That is, the photosensitive layer 660 containing the solvent may be in a fluid state having a viscosity allowing spin-coating to be carried out, so that the solvent within the photosensitive layer 660, which has been formed by completing the spin-coating, is to be removed. Most of the solvents are generally removed by thermal energy of the soft baking process, so that the photosensitive layer 660 can be converted from the fluid state to a solid state.

Figure 15:
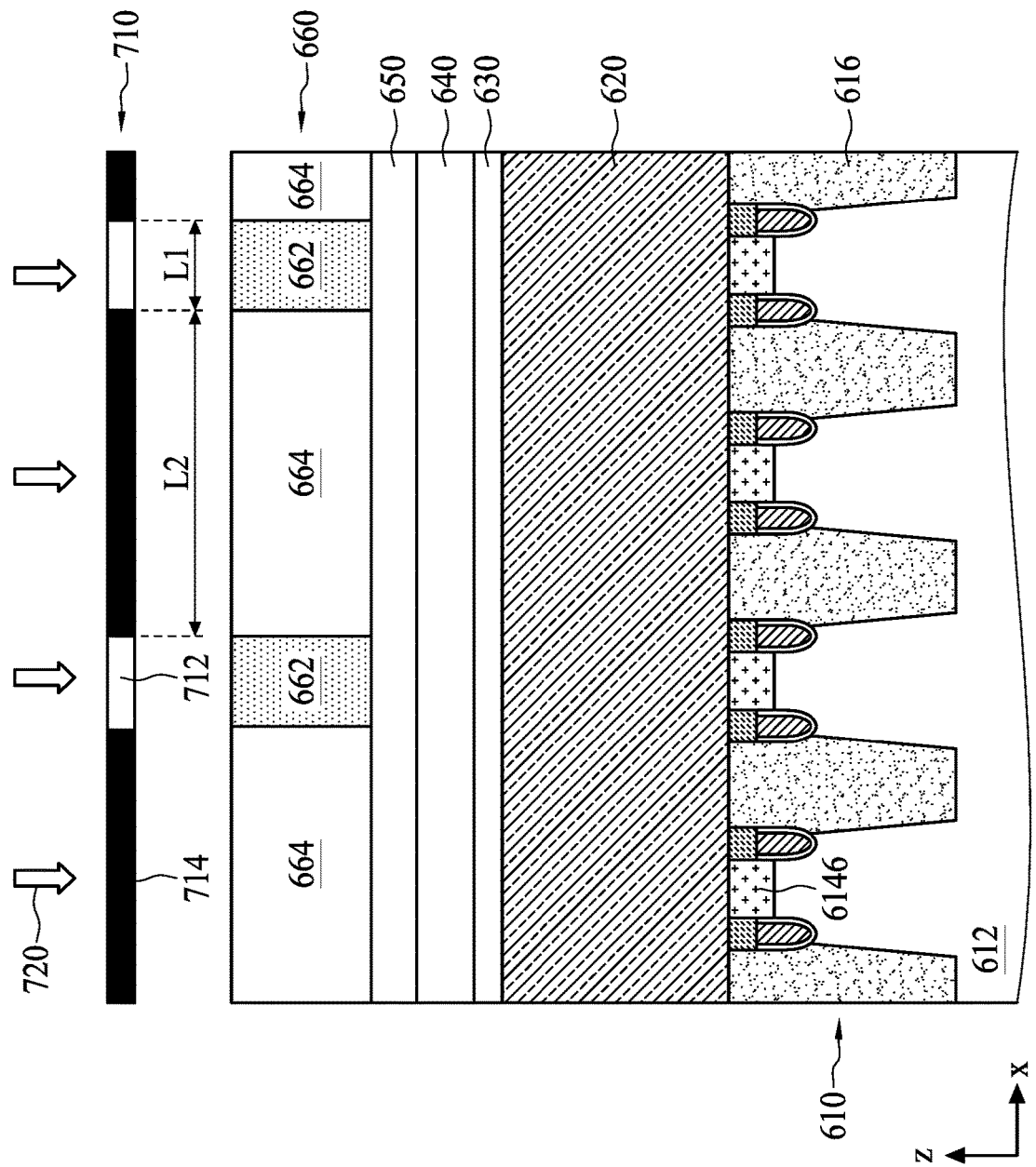

Referring to FIG. 15, a first mask 710, having a first geometric pattern, is placed over the photosensitive layer 660. The first geometric pattern includes a plurality of first transparent portions 712 and a plurality of first opaque portions 714. In some embodiments, the adjacent first transparent portions 712 are spaced apart by one first opaque portion 714. The first transparent portions 712 have a first length L1, the first opaque portions 714 have a second length L2, and the first length L1 is less than the second length L2.

Next, a first exposure process is performed to expose the photosensitive layer 660 to actinic radiation 720 through the first mask 710 according to step S508 in FIG. 10. The actinic radiation 720 projects the first geometric pattern of the first mask 710 on the photosensitive layer 660 to induce a photochemical reaction on the photosensitive layer 660. During the first exposure process, the first opaque portions 714 of the first mask 710 block the actinic radiation 720 from propagating through the first mask 710, and the first transparent portions 712 of the first mask 710 allow the actinic radiation 720 to pass through and irradiate the photosensitive layer 660, so that photochemical transformation occurs in portions of the photosensitive layer 660. The photosensitive layer 660 reacts with the actinic radiation 720 of a certain wavelength, and generally ultraviolet (UV) rays are used to expose the photoresist. However, an electromagnetic wave such as an X-ray, an electron beam, or an ion beam may be used. The first exposure process may be carried out in a stepper and/or scanner manner. After the first exposure process, the photosensitive layer 660 includes a plurality of first exposed portions 662 that correspond to the first transparent portions 712 of the first mask 710 and a plurality of first unexposed portions 664 that correspond to the first opaque portions 714 of the first mask 710.

Figure 16:
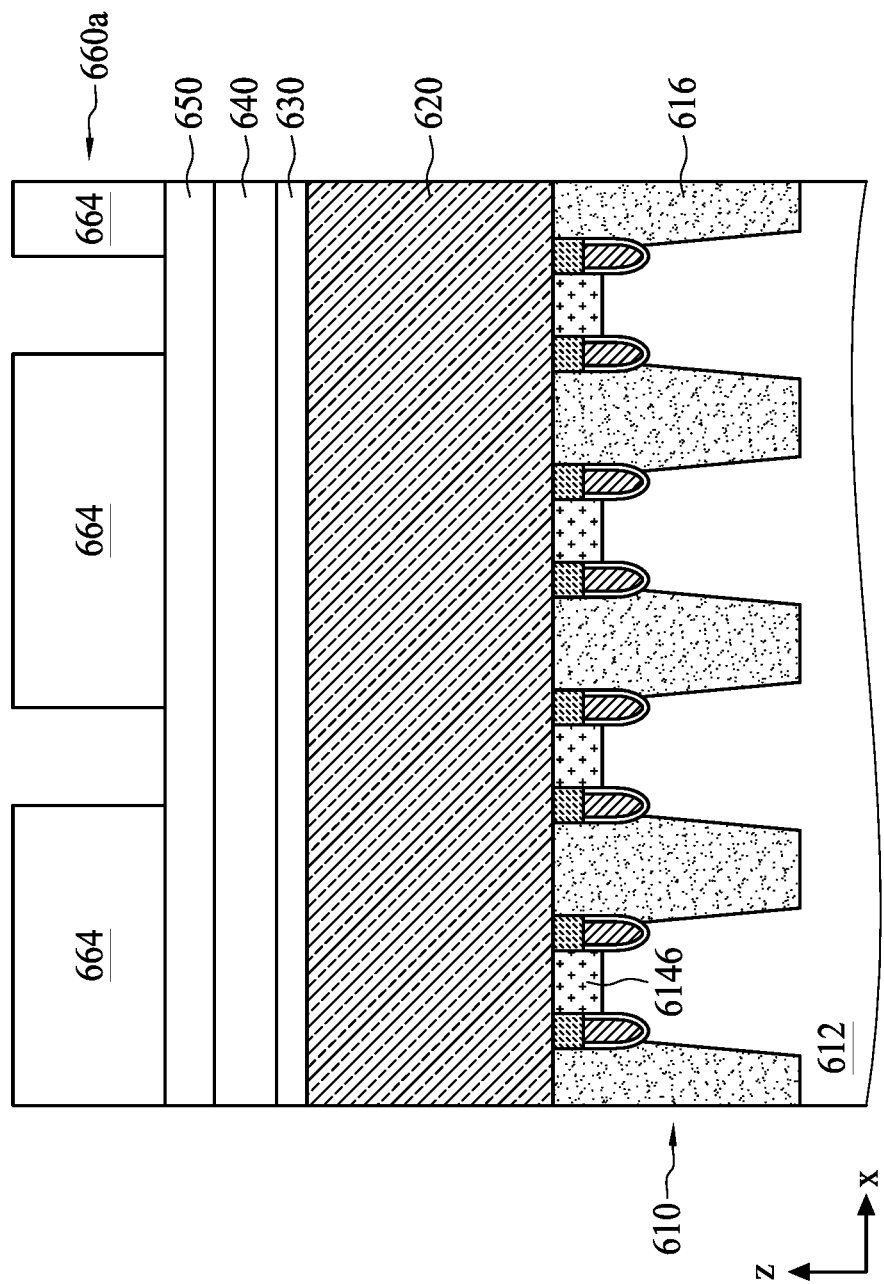

Referring to FIG. 16, a first developing process is performed to form an intermediate pattern 660a according to step 510 in FIG. 10. The first developing process provides the intermediate pattern 660a on the ARC layer 650 by using a solubility difference between the first exposed portions 662 and the first unexposed portions 664 with respect to a first developer. The first developing process using the first developer removes the first exposed portions 662, producing the intermediate pattern 660a comprising the first unexposed portions 664 on the ARC layer 650. The first developer may be an aqueous alkaline developer, particularly tetramethylammonium hydroxide (TMAH). The first developing process is referred to as positive-tone development (PTD). After the first developing process, portions of the ARC layer 650 which were previously covered by the first exposed portions 662 of the photosensitive layer 660 are exposed.

Figure 17:
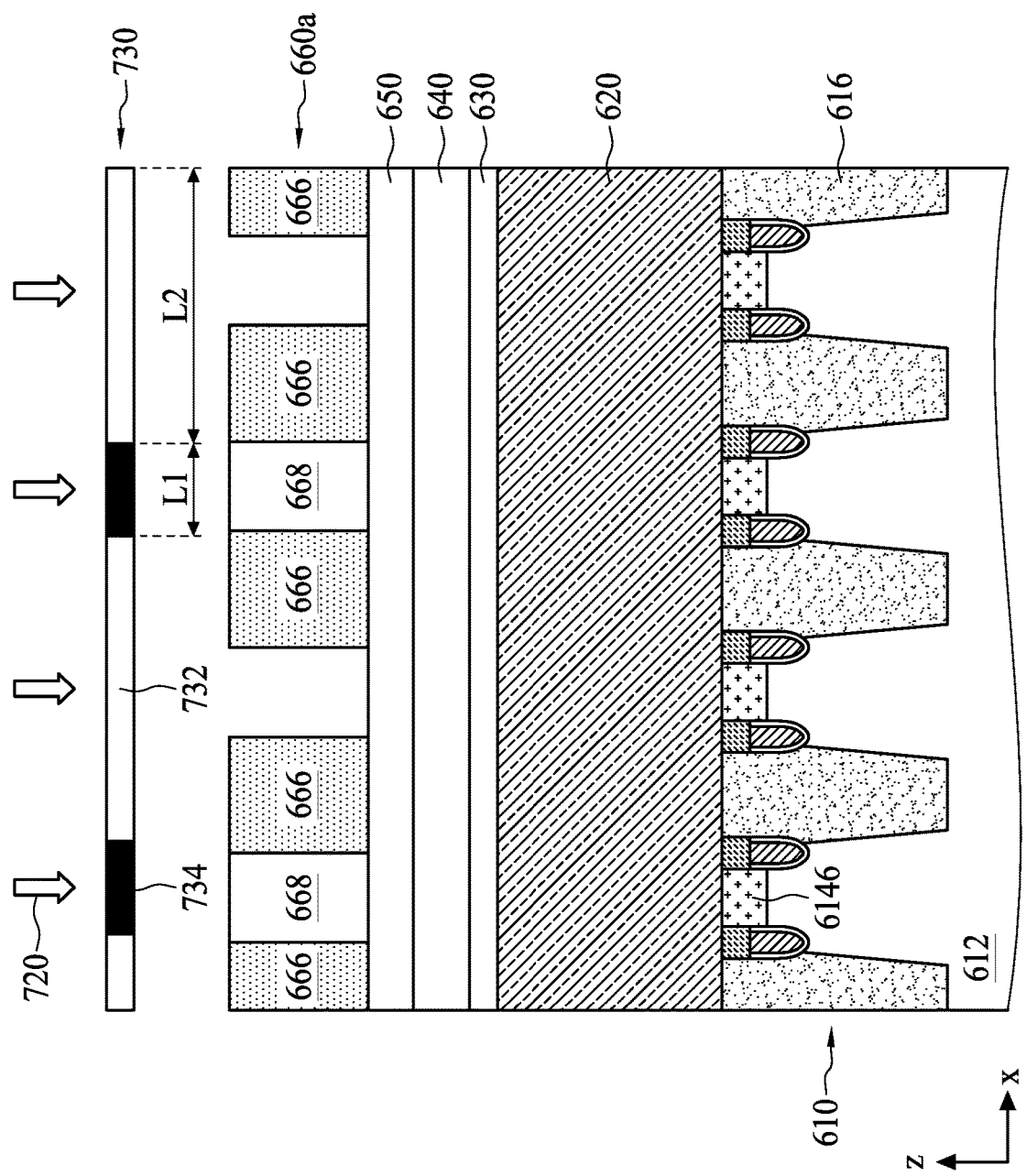

Referring to FIG. 17, a second mask 730 is placed over the ARC layer 650 and the intermediate pattern 660*a*. The second mask 730 has a second geometric pattern composed of a plurality of second transparent portions 732 which allow the actinic radiation 720 to pass through and a plurality of second opaque portions 734 which completely block the actinic radiation 720 from irradiating the intermediate pattern 660*a* of the photoresist. The first and second geometric patterns are complementary geometric patterns. That is, the second transparent portions 732 have the first length L1, the second opaque portions 734 have the second length L2, and the adjacent transparent portions 732 are spaced apart by one second opaque portion 734. Referring to FIGS. 16 and 17, the second opaque portions 734 for shielding the actinic radiation 720 may be arranged above the first unexposed portions 664, respectively. In addition, edges of the second opaque portions 734 are offset from edges of the first unexposed portions 664.

Next, a second exposure process is performed to expose the intermediate pattern 660*a* to the actinic radiation 720 through the second mask 730 according to step 512 in FIG. 10. Hence, the intermediate pattern 660*a* includes a plurality of second exposed portions 666 and a plurality of second unexposed portions 668.

Figure 18:
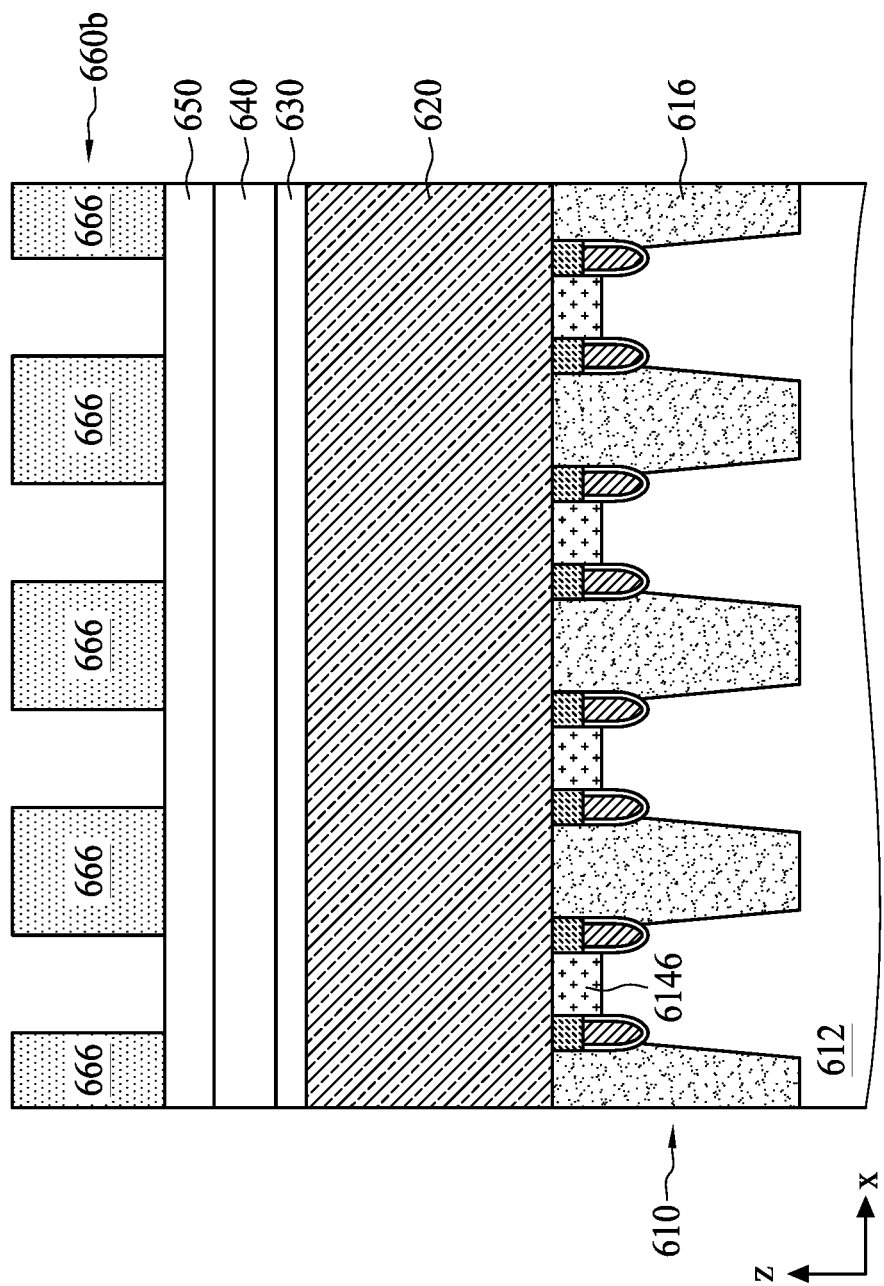

Referring to FIG. 18, a second developing process is performed to form a target pattern 660*b* for etching the ARC layer 650 and the sacrificial layer 640 according to step S514 in FIG. 10. The second developing process utilizes a second developer to preferentially remove the second unexposed portions 668 of the intermediate pattern 660*a*, while the second exposed portions 666 remain unaffected. The second developing process is referred to as negative-tone development (NTD) and uses organic solvents, such as anisole, as the second developers to produce the target pattern 660*b* on the ARC layer 650.

Figure 19:
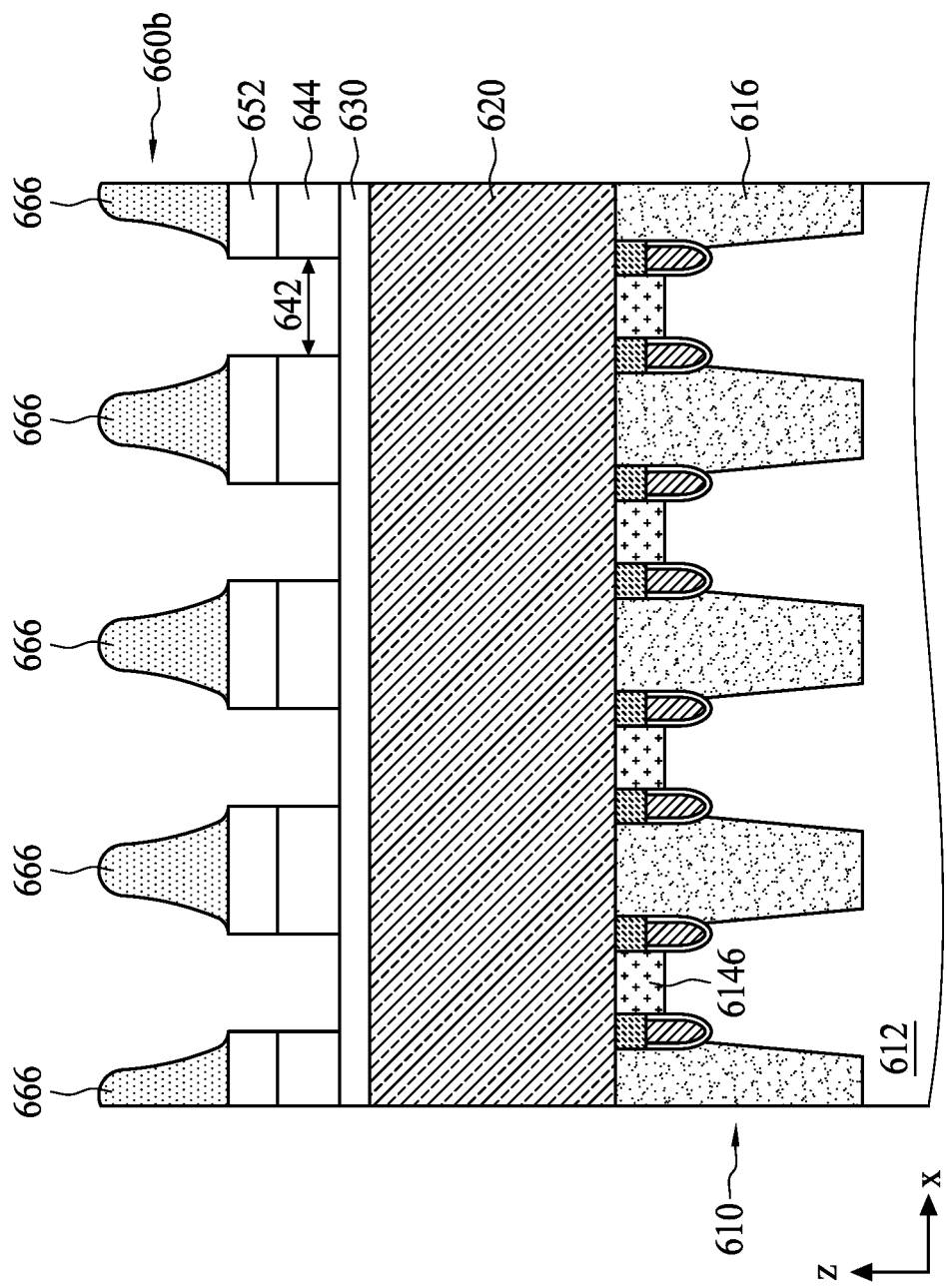

Referring to FIG. 19, a first etching process is performed to remove portions of the ARC layer 650 and the sacrificial layer 640 exposed by the target pattern 660*b* according to step S516 in FIG. 10. Therefore, a plurality of openings 642 are formed in the sacrificial layer 640 and the AR layer 650, thereby forming a patterned sacrificial layer 644 and a patterned ARC layer 652. Referring to FIGS. 18 and 19, the ARC layer 650 and the sacrificial layer 640 are etched by using the target pattern 660*b* as an etching mask to form a hardmask pattern on the buffer layer 630. The first etching process may be a plasma etching process using chemistries suitable for etching the ARC layer 650 and the sacrificial layer 640. The ARC layer 650 and the sacrificial layer 640 can be anisotropically dry-etched, using an RIE etching process, for example, so that the width of spaces between the second exposed portions 666 is maintained in the openings 642. It should be noted that the etching step may utilize multiple etchants, selected based on the materials of the sacrificial layer 640 and the ARC layer 650, to sequentially etch the ARC layer 650 and the sacrificial layer 640. The buffer layer 630 functions as an etch stop layer during the first etching process.

The target pattern 660*b* of the photoresist may be damaged sufficiently by the first etching process that it cannot be stripped cleanly and completely. Therefore, after the first etching process, an ashing process or a wet strip process is performed to remove a residual portion of the target pattern 660*b* according to step S518 in FIG. 10. The wet strip process may chemically alter the target pattern 660*b* so that it no longer adheres to the ARC layer 650.

Figure 20:
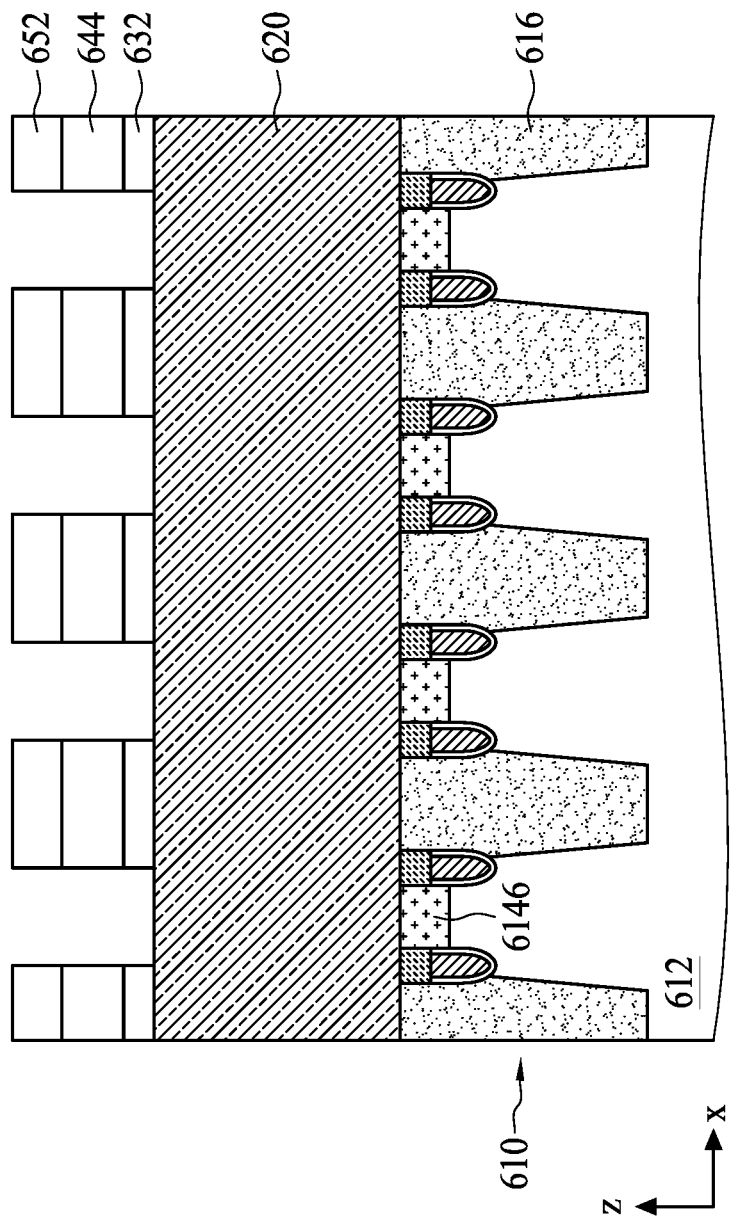

Referring to FIG. 20, a second etching process is performed according to step S520 in FIG. 10. The buffer layer 630 is etched using the patterned ARC layer 652 and the patterned sacrificial layer 644 as a hardmask to remove portions of the buffer layer 630. Hence, a patterned buffer layer 632 is formed and portions of the insulative layer 620 are exposed through the patterned buffer layer 632.

Figure 21:
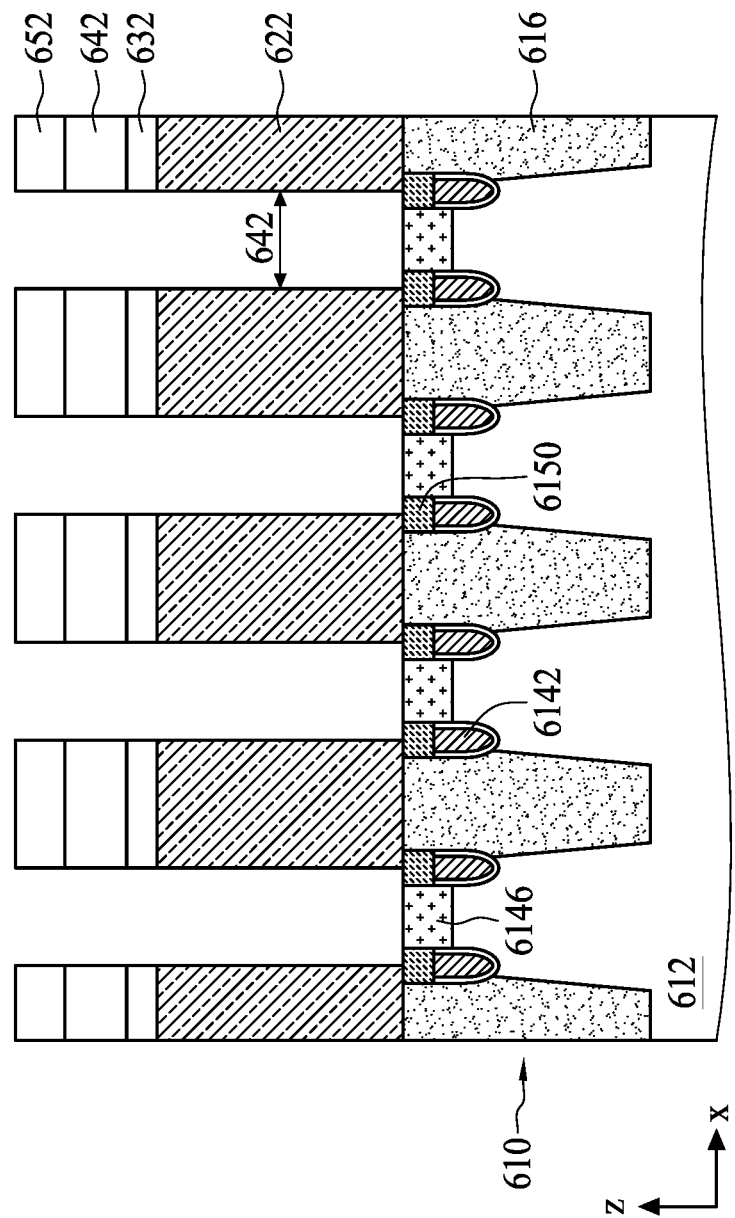

Referring to FIG. 21, a third etching process is performed according to step S522 in FIG. 10. The insulative layer 620 is etched using the patterned ARC layer 652, the patterned sacrificial layer 644 and the patterned buffer layer 632 as a hardmask. After the third etching process, the resulting insulative layer 622 has a plurality of trenches 624 transferred from the target pattern 660*a* of the photoresist (shown in FIG. 18), with the patterned sacrificial layer 642 over the resulting insulative layer 622. As illustrated in FIG. 21, the trenches 624 penetrate through the resulting insulative layer 622, and the first impurity regions 6146 and portions of the passivation layers 6150 capping the word lines 6142 are exposed to the trenches 624.

After completion of the third etching process, the method proceeds to step S523, in which the patterned ARC layer 652, the patterned sacrificial layer 644, and the patterned buffer layer 632 are removed by a suitable technique such as an ashing process and wet etching processes, resulting in the insulative layer 622 with the trenches 624.

Figure 22:
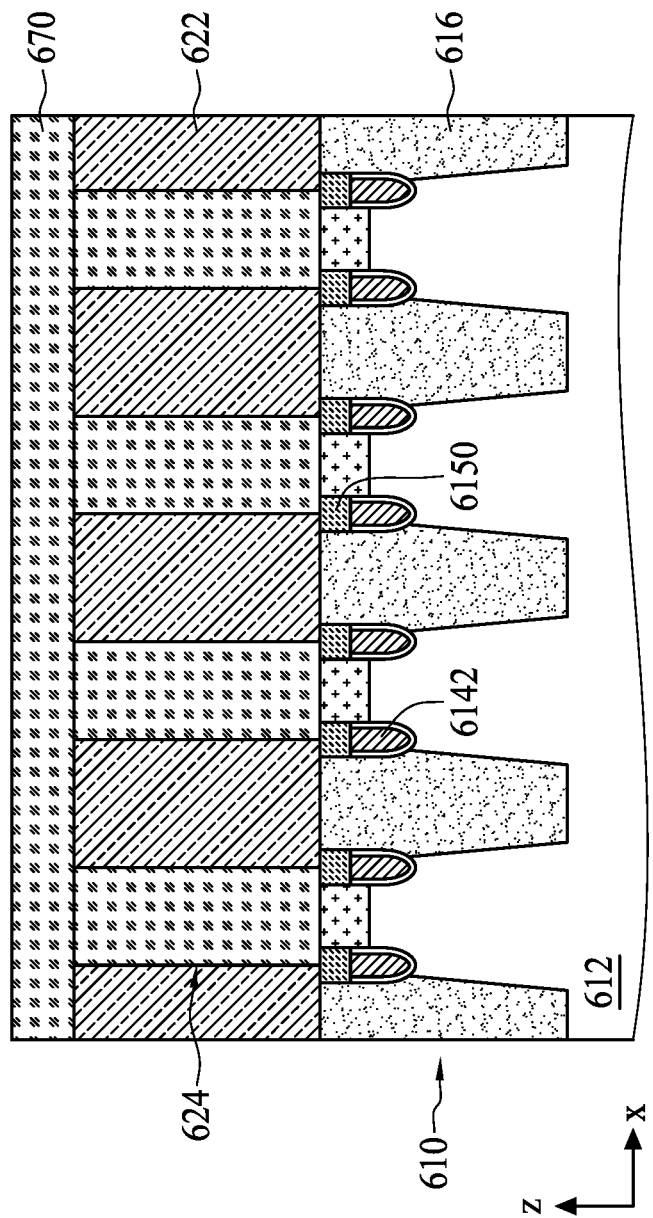

Referring to FIG. 22, a conductive material 670 is deposited in the trenches 624 according to step S524 in FIG. 10. The conductive material 670 is uniformly deposited on the insulative layer 622, the first impurity regions 6146 and the portions of the passivation layers 6150 until the trenches 624 are entirely filled. The conductive material 670 is made of conductive material, such as doped polysilicon. The conductive material 670 is deposited using a plating process or a CVD process.

Figure 23:
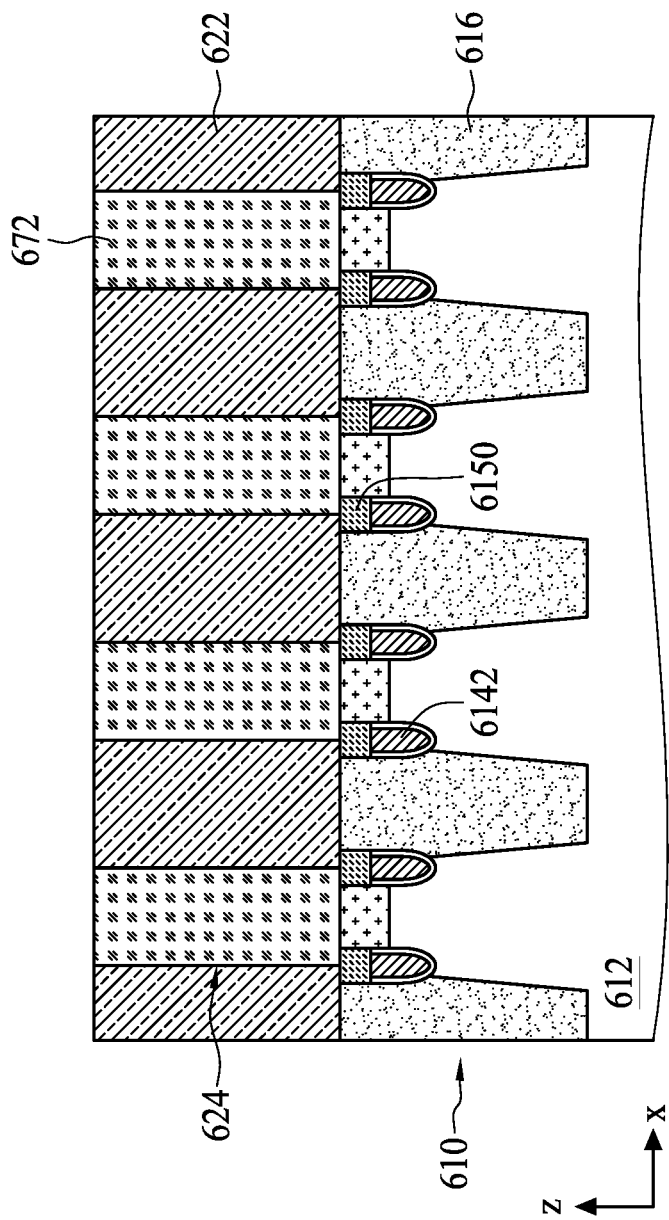

Next, the method 500 proceeds to step S526, in which a planarizing process is performed to remove the conductive material 670 above the trenches 624. Consequently, a plurality of bit line contacts 672, as shown in FIG. 23, are formed. After the removal of the superfluous conductive material 670, the insulative layer 622 is exposed.

In conclusion, the method utilizes a dual-tone development approach that performs a positive-tone development followed by a negative-tone development for the formation of the target pattern 660*b*, and patterns the hark mask layers comprised of the ARC layer 650 and the sacrificial layer 640 using the target pattern 660*a* in an etching process; therefore, correctness of the formed pattern in the ARC layer 650 and the sacrificial layer 640 can be maintained.

One aspect of the present disclosure provides a method of patterning a substrate. The method comprises steps of forming a photosensitive layer on the substrate; performing a first exposure process to expose the photosensitive layer to actinic radiation through a first mask; performing a first developing process to remove portions of the photosensitive layer exposed to the actinic radiation and form an intermediate pattern; performing a second exposure process to expose the intermediate pattern to the actinic radiation through a second mask; performing a second developing process to remove portions of the intermediate pattern shielded from the actinic radiation and form a target pattern; and performing an etching process to remove portions of the substrate exposed by the target pattern.

One aspect of the present disclosure provides a method of fabricating bit line contacts of a semiconductor storage device. The method comprises steps of depositing an insulative layer and a sacrificial layer on a substrate comprising a plurality of access transistors; forming a photosensitive layer on the sacrificial layer; performing a first exposure process to expose the photosensitive layer to actinic radiation through a first mask; performing a first developing process to form an intermediate pattern on the sacrificial layer; performing a second exposure process to expose the intermediate pattern to the actinic radiation through a second mask; performing a second developing process to form a target pattern on the sacrificial layer; performing a first etching process to remove portions of the sacrificial layer exposed by the target pattern; performing a second etching process to form a plurality of trenches in the insulative layer, wherein first impurity regions of the access transistors are exposed to the trenches; and depositing a conductive material in the trenches to form the bit line contacts.

One aspect of the present disclosure provides a method of forming openings in a sacrificial layer for patterning a substrate. The method comprises steps of forming the sacrificial layer on the substrate; forming a photosensitive layer on the sacrificial layer; performing a first lithographing process to remove portions of the photosensitive layer exposed to actinic radiation and form an intermediate pattern on the sacrificial layer; performing a second lithographing process to remove portions of the intermediate pattern shielded from the actinic radiation and form a target pattern on the sacrificial layer; and etching through the target pattern to form the openings in the sacrificial layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of processing a substrate, comprising:
    forming a photosensitive layer on the substrate;
    performing a first exposure process to expose the photosensitive layer to actinic radiation through a first mask, wherein the first mask has a plurality of first opaque portions;
    performing a first developing process to remove portions of the photosensitive layer exposed to the actinic radiation and form an intermediate pattern;
    performing a second exposure process to expose the intermediate pattern to the actinic radiation through a second mask, wherein the second mask has a plurality of second opaque portions;
    performing a second developing process to remove portions of the intermediate pattern shielded from the actinic radiation and form a target pattern; and
    performing an etching process to remove portions of the substrate exposed through the target pattern;
    wherein during the second exposure process, an alignment of the second mask is set at a position that centers of the plurality of second opaque portions of the second mask are aligned with centers of the plurality of first opaque portions.

2. The method of claim 1, wherein the first mask and the second mask have complementary geometric patterns.

3. The method of claim 2, wherein the first mask has a plurality of first transparent portions alternately arranged with the first opaque portions, the second mask has a plurality of second transparent portions alternately arranged the second opaque portions,
    wherein the plurality of first transparent portions and the plurality of second opaque portions have a first length, such that a length of each of the first transparent portions of the first mask is equal to a length of each of the second opaque portions of the second mask,
    wherein the plurality of first opaque portions and the plurality of second transparent portions have a second length different from the first length, such that a length of each of the first opaque portions of the first mask is equal to a length of each of the second transparent portions of the second mask.

4. The method of claim 3, wherein the first length is less than the second length.

5. The method of claim 3, wherein after the first exposure process, the photosensitive layer includes a plurality of first exposed portions that correspond to the plurality of first transparent portions of the first mask and a plurality of first unexposed portions that correspond to the plurality of first opaque portions of the first mask, and the first developing process utilizes a positive-tone developer to remove the plurality of first exposed portions.

6. The method of claim 5, wherein after the second exposure process, the intermediate pattern includes a plurality of second exposed portions that correspond to the plurality of second transparent portions of the second mask and a plurality of second unexposed portions that correspond to the plurality of second opaque portions of the second mask, and the second developing process utilizes a negative-tone developer to remove the plurality of second unexposed portions.

7. The method of claim 5, wherein during the second exposure process, the plurality of second opaque portions are arranged above the plurality of first unexposed portions, respectively.

8. The method of claim 7, wherein the first mask has a first pitch defined as a length between one of the first transparent portions and the first opaque portion adjacent thereto, wherein the second mask has a second pitch defined as a length between one of the second transparent portions and the second opaque portion adjacent thereto, wherein the first pitch is equal to the second pitch.

9. The method of claim 1, further comprising depositing an antireflective coating (ARC) layer on the substrate prior to the formation of the photosensitive layer, such that the antireflective coating is formed between the substrate and the photosensitive layer after the formation of the photosensitive layer, wherein portions of the ARC layer and the portions of the substrate exposed to the target pattern are removed during the etching process.

10. A method of processing a substrate, comprising:
forming the sacrificial layer on the substrate;
forming a photosensitive layer on the sacrificial layer;
performing a first lithographing process to remove portions of the photosensitive layer exposed to actinic radiation and form an intermediate pattern on the sacrificial layer;
performing a second lithographing process to remove portions of the intermediate pattern shielded from the actinic radiation and form a target pattern on the sacrificial layer; and
etching through the target pattern to remove portions of the substrate and to remove portions of the sacrificial layer in order to form openings in the sacrificial layer.

11. The method of claim 10, wherein the photosensitive layer is exposed to the actinic radiation through a first mask during the first lithographing process, the intermediate pattern is exposed to the actinic radiation through a second mask during the second lithographing process, and the first and second masks have complementary geometric patterns;
wherein the first mask has a plurality of first transparent portions and a plurality of first opaque portions alternately arranged with the plurality of first transparent portions;
wherein the second mask has a plurality of second transparent portions and a plurality of second opaque portions alternately arranged with the plurality of second transparent portions;
wherein during the second lithographing process, an alignment of the second mask is set at a position that centers of the plurality of second opaque portions of the second mask are aligned with centers of the plurality of first opaque portions.

12. The method of claim 11,
wherein a length of each of the first transparent portions of the first mask is equal to a length of each of the second opaque portions of the second mask;
wherein a length of each of the first opaque portions of the first mask is equal to a length of each of the second transparent portions of the second mask.

13. The method of claim 10, wherein the intermediate pattern is formed using a positive-tone development, and the target pattern is formed using a negative-tone development.

* * * * *